(12) United States Patent
Oh et al.

(10) Patent No.: US 8,396,682 B2
(45) Date of Patent: Mar. 12, 2013

(54) SEMICONDUCTOR DEVICE

(75) Inventors: Chi-Sung Oh, Gunpo-si (KR); Dong-Hyuk Lee, Seoul (KR); Ho-Cheol Lee, Yongin-si (KR); Jang-Woo Ryu, Seoul (KR); Jung-Bae Lee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 337 days.

(21) Appl. No.: 12/900,547

(22) Filed: Oct. 8, 2010

(65) Prior Publication Data

US 2011/0093235 A1 Apr. 21, 2011

(30) Foreign Application Priority Data

Oct. 16, 2009 (KR) .................. 10-2009-0098489
Jul. 9, 2010 (KR) .................. 10-2010-0066439

(51) Int. Cl.
*G01R 27/28* (2006.01)
*G06F 19/00* (2006.01)

(52) U.S. Cl. ............... 702/120; 324/750.3; 324/762.02; 365/230.03; 438/10; 438/14; 702/118; 702/121

(58) Field of Classification Search .......... 702/117–121; 257/727, 778, 781, 783; 324/750.3, 762.02, 324/762.03; 365/189.05, 230.03; 438/10, 438/14

See application file for complete search history.

(56) References Cited

U.S. PATENT DOCUMENTS

| 5,985,682 | A  | * | 11/1999 | Higgins, III ............... 438/10 |
| 6,424,587 | B1 |   | 7/2002 | Hosoda |
| 6,562,637 | B1 | * | 5/2003 | Akram et al. .............. 438/14 |
| 7,400,134 | B2 | * | 7/2008 | Morishita et al. ........ 324/762.02 |
| 8,067,950 | B2 | * | 11/2011 | Nagai et al. .............. 324/750.3 |

FOREIGN PATENT DOCUMENTS

| JP | 2002-056696 | 2/2002 |
| JP | 2002-076075 | 3/2002 |
| JP | 2004-281633 | 10/2004 |
| JP | 2007-178396 | 7/2007 |
| JP | 2009-139273 | 6/2009 |
| KR | 1020020013697 | 2/2002 |
| KR | 1020070036616 | 4/2007 |
| KR | 1020090005918 | 7/2007 |
| KR | 1020090000490 | 1/2009 |
| KR | 1020090003641 | 1/2009 |

* cited by examiner

*Primary Examiner* — John H Le
(74) *Attorney, Agent, or Firm* — F. Chau & Associates, LLC

(57) ABSTRACT

A semiconductor device is provided. The semiconductor device applies data applied through a bump pad on which a bump is mounted through a test pad to a test apparatus such that the reliability of the test can be improved. The amount of test pads is significantly reduced by allowing data output through bump pads to be selectively applied to a test pad. Data and signals applied from test pads are synchronized with each other and applied to bump pads during a test operation such that the reliability of the test can be improved without the need of an additional test chip.

20 Claims, 16 Drawing Sheets

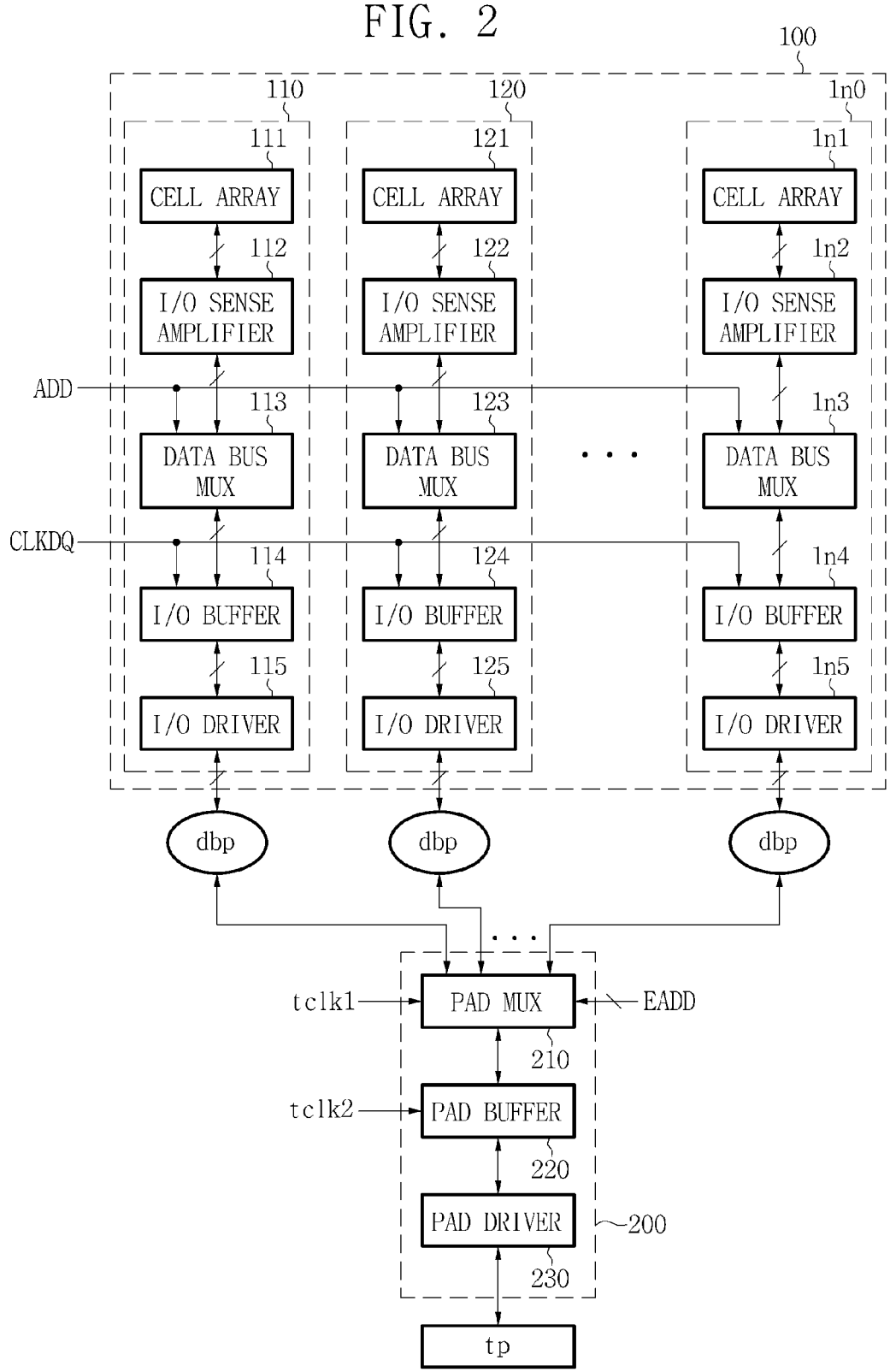

SEMICONDUCTOR DEVICE

CROSS-REFERENCE TO RELATED APPLICATIONS

This application claims under 35 U.S.C. §119 priority to and the benefit of Korean Patent Applications No. 10-2009-0098489, filed on Oct. 16, 2009 and No. 10-2010-0066439, filed on Jul. 9, 2010, the entire content of which is incorporated by reference herein.

BACKGROUND

1. Technical Field

The present disclosure relates to semiconductor devices and semiconductor device test systems, and more particularly, to a semiconductor device capable of improving the reliability of a test.

2. Discussion of Related Art

As semiconductor devices increase in capacity and become more highly integrated, the amount of data that is simultaneously input and output is increasing. For this reason, the amount of input/output (I/O) pins that can be simultaneously accessed needs to increase to improve the performance of semiconductor devices. To meet this need, μ-bump technique has been developed as new packaging technology.

However, when the μ-bump technique is applied, it can be difficult to directly probe a bump pad during a wafer test of a semiconductor device because the size of the bump pad on which a μ-bump is disposed is very small. Also, to prevent a scratch on a bump pad on which a μ-bump will be mounted, the bump pad should not be directly probed.

SUMMARY

Exemplary embodiments provide a semiconductor device that can be readily and reliably tested.

Exemplary embodiments also provide a semiconductor device having a bump allowing a reliable test without an additional test chip.

According to an exemplary embodiment a semiconductor device includes a plurality of bump pads on which μ-bumps are mounted. An internal circuit is configured to exchange data with the outside through the bump pads and to perform a predetermined operation. A plurality of test pads fewer than the bump pads is provided, and each test pad is configured to exchange data between a corresponding at least one of the bump pads and a test apparatus during a test operation. A test data selector is connected between the bump pads and the test pads, and configured to select a predetermined amount of bump pads from among the bump pads in response to an extended address applied from the test apparatus and to exchange data between the selected bump pads and a test pad corresponding to the selected bump pads.

The test data selector may include one or more pad multiplexers (MUXs) configured to select the predetermined amount of bump pads in response to the extended address and to exchange the data through the selected bump pads, and one or more pad buffers configured to receive data from the pad MUXs, and to buffer and output the data to the corresponding test pad or to buffer data applied from the corresponding test pad and apply the data to a corresponding pad MUX among the pad MUXs.

The test data selector may operate at the same operating speed as the internal circuit.

The test data selector may operate at an operating speed that is multiple times an operating speed of the internal circuit.

The internal circuit may include a clock input buffer connected to one of the test pads and configured to receive a test clock signal applied from the test apparatus in response to a test mode signal and to generate an internal clock signal, and outputs sampling data for measuring a data output time in response to the internal clock signal.

The semiconductor device may further include a sampling circuit disposed adjacent to a data bump pad from which the sampling data is output among the bump pads and configured to detect the sampling data in response to a strobe signal applied from the test apparatus and to output a determination signal to a corresponding test pad among the test pads. A path through which the strobe signal is applied from the test apparatus to the sampling circuit may have the same length as a path through which the test clock signal is applied from the test apparatus to the clock input buffer.

The sampling circuit may include a data determiner configured to receive the strobe signal in response to the test mode signal, to detect the sampling data in response to the strobe signal, and to output the determination signal, and a sampling buffer configured to buffer and output the determination signal in response to the test clock signal.

A phase of the strobe signal may be initially the same as a phase of the test clock signal, but gradually slows down.

The semiconductor device may further include an extended test pad disposed adjacent to and connected to one or more dummy bump pads.

One or more of the bump pads may be the dummy bump pads.

Each of the dummy bump pads may receive the same data as a corresponding bump pad among the bump pads.

During the test operation, the test apparatus may additionally output a test mode signal, a test clock signal, and a strobe signal, receives a determination signal from the semiconductor device, and measures a data output time.

The test apparatus may output the strobe signal with a phase that is initially the same as a phase of the test clock signal, but gradually slows down.

The test apparatus may perform an input/output (I/O) buffer information specification (IBIS) test through the extended test pad.

According to an exemplary embodiment a semiconductor device includes a plurality of bump pads, a plurality of test pads configured to exchange test data with respective corresponding bump pads during a test operation, and a delay adjuster connected between the bump pads and the test pads and configured to synchronize the test data with each other by delaying the test data for different time periods.

The test data may include a clock signal, data, and a command, and the delay adjuster may include an input delay adjuster configured to synchronize the data and the command with the clock signal and transfer the clock signal, the synchronized data, and the synchronized command to the bump pads corresponding to the respective test pads when the test data is applied through the test pads.

The input delay adjuster may include a clock delayer configured to delay the clock signal applied through the test pad, and a plurality of delayers configured to synchronize the data and the command applied through the test pads with the clock signal and output the clock signal, the synchronized data, and the synchronized command to the bump pads corresponding to the respective test pads.

The input delay adjuster may include a clock delayer configured to delay the clock signal applied through the test pad, a clock generator configured to generate and output a synchronization clock signal in response to the clock signal, and a plurality of latches configured to synchronize the data and the command applied through the test pads with the clock signal and output the clock signal, the synchronized data, and the synchronized command to the bump pads corresponding to the respective test pads in response to the synchronization clock signal.

The delay adjuster may further include an output delay adjuster configured to synchronize the data and the command with the clock signal and transfer the clock signal, the synchronized data, and the synchronized command to the test pads corresponding to the respective bump pads when the test data is applied through the bump pads.

According to an exemplary embodiment a semiconductor device includes a plurality of stacked chips, wherein at least one of the chips includes a plurality of bump pads, a plurality of test pads configured to exchange test data with respective corresponding bump pads during a test operation, and a delay adjuster connected between the bump pads and the test pads and configured to synchronize the test data with each other by delaying the test data for different time periods.

The test data may include a clock signal, data, and a command, and the delay adjuster may include an input delay adjuster configured to synchronize the data and the command with the clock signal and transfer the clock signal, the synchronized data, and the synchronized command to the bump pads corresponding to the respective test pads when the test data is applied through the test pads.

The delay adjuster may further include an output delay adjuster configured to synchronize the data and the command with the clock signal and transfer the clock signal, the synchronized data, and the synchronized command to the test pads corresponding to the respective bump pads when the test data is applied through the bump pads.

Each of the chips may activate or deactivate the delay adjuster in response to a chip identification number applied from the outside.

Each of the chips may include a selection activator configured to receive a plurality of chip activation signals for selectively activating the delay adjuster and transfer the chip activation signals to an adjacent chip.

BRIEF DESCRIPTION OF THE DRAWINGS

Exemplary embodiments are described in further detail below with reference to the accompanying drawings. It should be understood that various aspects of the drawings may have been exaggerated for clarity.

FIG. 2 is a block diagram illustrating an exemplary operation of a test data selector of FIG. 1.

DETAILED DESCRIPTION OF THE EMBODIMENTS

Various exemplary embodiments will now be described more fully with reference to the accompanying drawings in which exemplary embodiments are shown. The present inventive concept may, however, be embodied in many different forms and should not be construed as limited to the exemplary embodiments set forth herein.

It will be understood that when an element is referred to as being "connected" or "coupled" to another element, it can be directly connected or coupled to the other element or intervening elements may be present.

Exemplary embodiments relate to a semiconductor device and a test system of the semiconductor device. Like numbers refer to like elements throughout the description of the figures.

Figure 1A:
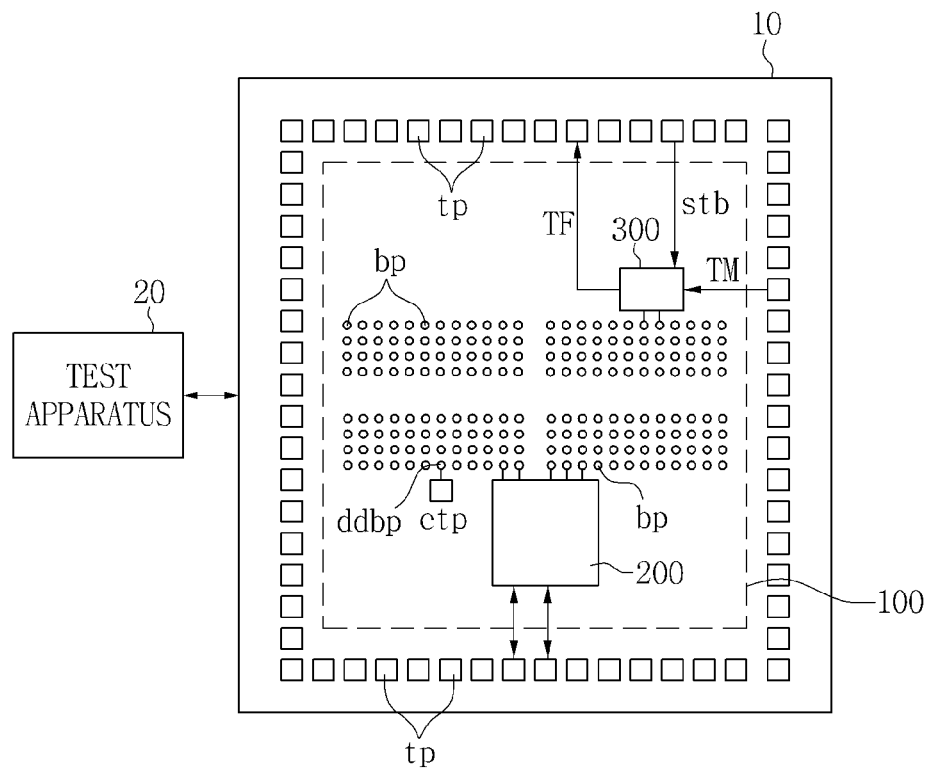
FIGS. 1A and 1B are block diagrams of a semiconductor device having a bump according to exemplary embodiments.
Figure 1B:
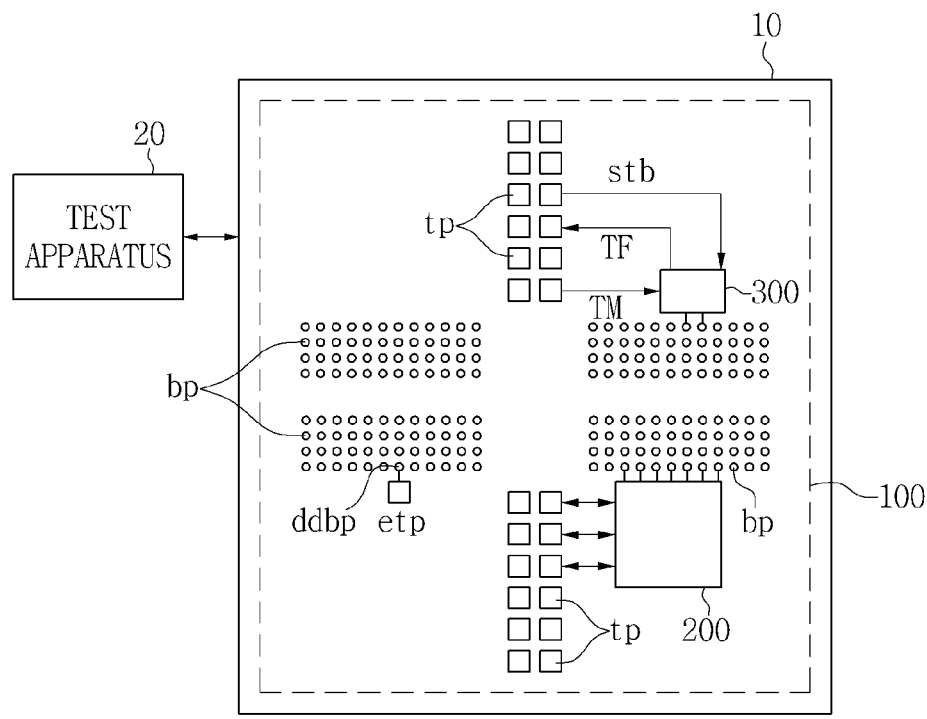

FIGS. 1A and 1B are block diagrams of a semiconductor device having a bump according to exemplary embodiments. A semiconductor device 10 includes an internal circuit 100, a test data selector 200, a sampling circuit 300, a plurality of bump pads bp, and a plurality of test pads tp.

The internal circuit 100 performs various designated operations. The internal circuit 100 exchanges data with the outside through μ-bumps mounted on the bump pads bp during a normal operation, and receives and outputs data with a test apparatus 20 through the test pads tp directly connected to the bump pads bp during a test operation. When the semiconductor device 10 is a semiconductor memory device, the semiconductor device 10 may have a plurality of banks or a plurality of channels, each of which has a plurality of memory cells for storing data applied from the outside or for outputting stored data to the outside.

Although only data is mentioned for convenience, the internal circuit 100 may receive and output additional signals, such as clock signals, as well as data, through the bump pads bp or the test pads tp. Also, the internal circuit 100 may have an additional circuit(s) for use of the semiconductor device 10. For example, an additional circuit may be a control circuit, a temperature sensing circuit, and the like.

The test data selector 200 selects a predetermined amount of pieces of data among data output through a plurality of bump pads bp in response to an extended address applied during the test operation, and applies the selected data to a test pad tp or applies data applied through a test pad tp to bump pads bp corresponding to the extended address. In other words, one test pad tp corresponds to a plurality of bump pads bp so that all data of the semiconductor device 10 can be tested even if there are fewer of the test pads tp than the bump pads bp.

The μ-bumps for exchanging data of the semiconductor device 10 with the outside are mounted on the bump pads bp. The size of solder cream (paste) for μ-bumps is 5 to 10 μm. The bump pads bp have a size corresponding to the size of the solder cream because the bump pads bp are used for flip-chip packaging (or bump packaging). Flip-chip packaging is not a specific package or specific package form but an assembly method for electrically connecting a die with an electrode terminal. Unlike wire-bonding packaging that employs a wire as an interconnection, flip-chip packaging employs a conductive bump on the surface of a die as an interconnection. A bump formed on a die is turned upside down and directly connected to a carrier, and thus is referred to as a flip chip. Flip-chip packaging is used for system-on-chip (SoC), system-in-package (SiP), and system-on-package (SoP). Thus, the amount of the bump pads bp corresponds to the amount of all data and signals that the semiconductor device 10 exchanges with the outside.

The semiconductor device 10 according to exemplary embodiments additionally has at least one of the bump pads bp as a dummy bump pad ddbp. The dummy bump pad ddbp is intended for an input/output (I/O) buffer information specification (IBIS) test, which will be described in more detail below. The IBIS test provides voltage-current (VI) and voltage-time (VT) information of a digital I/O pin, and describes characteristics of a packaging parasitic component and an electrostatic discharge (ESD) prevention circuit. Since its first version in 1993 IBIS has become a standard for electronic behavioral specifications of integrated circuit input/output analog characteristics.

The test pads tp are prepared for probing during a wafer test instead of the bump pads bp because the bump pads bp cannot be directly probed in view of the size of the bump pads bp and their mounting stability. The test pads tp have a much larger size than the bump pads bp and can be readily probed with a test probe. Typically, the test pads tp have a amount equal to the amount of the bump pads bp. However, in exemplary embodiments of the inventive concept, the amount of the test pads tp may be less than the amount of the bump pads bp (e.g., about 1/16 of the amount of the bump pads bp). Further, an extended test pad etp among the test pads tp can be disposed adjacent to the dummy bump pad ddbp for an IBIS test.

The sampling circuit 300 is activated during the test operation and measures a data output time tSAC of the semiconductor device 10. The data output time tSAC is the time taken for a data output buffer (not shown) in the internal circuit 100 to output applied data to the outside, and is specified according to the specification of the semiconductor device 10. The sampling circuit 300 is activated in response to a test mode signal TM applied from a test apparatus 20 during the test operation, and detects data output through the bump pads bp while adjusting the time difference between a test clock signal tclk and a strobe signal stb, thereby measuring the data output time tSAC. An exemplary method in which the sampling circuit 300 measures the data output time tSAC will be described in more detail below.

FIG. 1A shows an exemplary embodiment of the semiconductor device 10 in which the test pads tp are disposed in a peripheral region, and FIG. 1B shows an exemplary embodiment of the semiconductor device 10 in which the test pads tp are disposed in a central region. The disposition or arrangement of the test pads tp in the semiconductor device 10 is not limited to the exemplary embodiments depicted in FIGS. 1A and 1B but may vary. However, the extended test pad etp is normally disposed adjacent to the dummy bump pad ddbp as mentioned above. Also, the disposition or arrangement of the bump pads bp, the test data selector 200, and the sampling circuit 300 may also vary.

Since the test pads tp and the test data selector 200 are used for a wafer test and are not used after the wafer test, the test pads tp and the test data selector 200 are typically removed from the package of the semiconductor device 10 by a sawing process after the wafer test. The test pads tp occupy a large area in the semiconductor device 10, and thus it is possible to reduce the size of the semiconductor device 10 by removing the test pads tp and the test data selector 200 during a packaging process. When the test pads tp are disposed in the peripheral region of the semiconductor device 10 as shown in FIG. 1A, the test pads tp and the test data selector 200 are readily removed during the packaging process.

FIG. 2 is a block diagram illustrating an exemplary operation of the test data selector 200 of FIG. 1.

When the semiconductor device 10 is a semiconductor memory device, the internal circuit 100 may have a plurality of memory blocks or channels. FIG. 2 shows a semiconductor memory device having a plurality of channels 110, 120, . . . 1n0 as an exemplary semiconductor device 10. The respective channels 110, 120, . . . 1n0 have cell arrays 111, 121, . . . 1n1, each of which has a plurality of memory cells, I/O sense amplifiers 112, 122, . . . 1n2, each of which exchanges data with the memory cells, data bus multiplexers (MUXs) 113, 123, . . . 1n3 which select a predetermined amount of pieces of data from among data output from the I/O sense amplifiers 112, 122, . . . 1n2 and output the selected data, I/O buffers 114, 124, . . . 1n4 which buffer the data output from the data bus MUXs 113, 123, . . . 1n3 in response to a data clock signal CLKDQ, and I/O drivers 115, 125, . . . 1n5 which output the buffered data to the corresponding data bump pads dbp.

For convenience, it is shown in FIG. 2 that the channels 110, 120, . . . 1n0 have the cell arrays 111, 121, . . . 1n1, the I/O sense amplifiers 112, 122, . . . 1n2, the data bus MUXs 113, 123, . . . 1n3, the I/O buffers 114, 124, . . . 1n4, and the I/O drivers 115, 125, . . . 1n5 respectively, but the amount of the components may vary. Although it is shown that only the data bus MUXs 113, 123, . . . 1n3 receive an address signal ADD in the internal circuit 100, the respective cell arrays 111, 121, . . . 1n1 and the respective I/O sense amplifiers 112, 122, . . . 1n2 may also receive the address signal ADD. To simplify the drawing, it is shown in FIG. 2 that only one data bump pad dbp is prepared for each of the channels 110, 120, . . . 1n0, but each of the channels 110, 120, . . . 1n0 can actually have as many data bump pads dbp as the amount of bits output from the channel.

The test data selector 200 has a pad MUX 210, a pad buffer 220, and a pad driver 230. Like the channels 110, 120, . . . 1n0 of the internal circuit 100, it is shown that the test data selector 200 has one each of the pad MUX 210, the pad buffer 220, and the pad driver 230. However, there may be multiple numbers of each of the components.

The pad MUX 210 receives data applied from a predetermined amount of the corresponding data bump pads dbp among the data bump pads dbp in response to a first test clock signal tclk1, selects data applied from at least one of the corresponding data bump pads dbp in response to an extended address signal EADD, and outputs the selected data. The pad buffer 220 buffers and outputs the data applied from the pad MUX 210 in response to a second test clock signal tclk2, and the pad driver 230 drives the data output from the pad buffer 220 and outputs the data to the corresponding test pad tp.

Figure 3A:
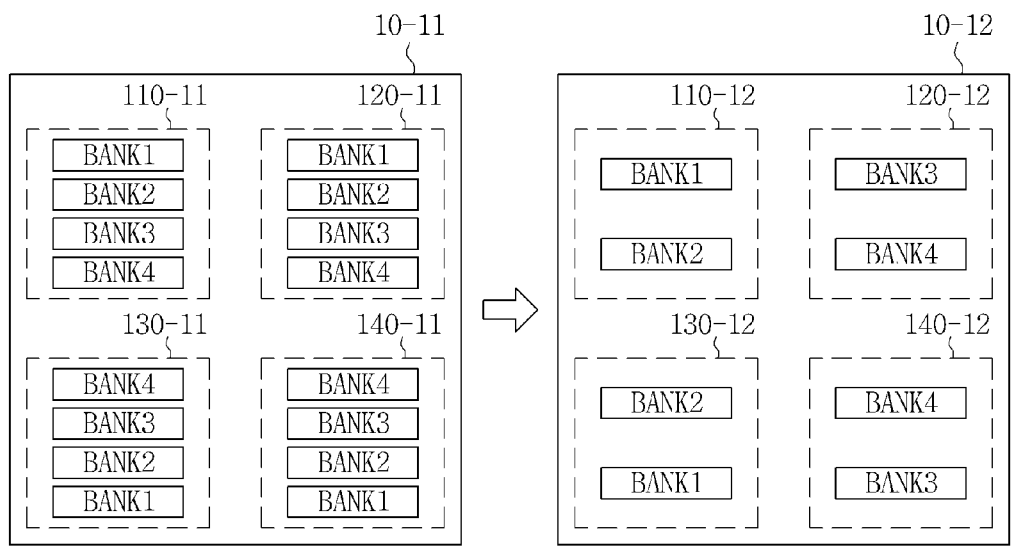
FIGS. 3A and 3B are block diagrams illustrating exemplary methods of testing a semiconductor device using fewer test pads than bump pads.
Figure 3B:
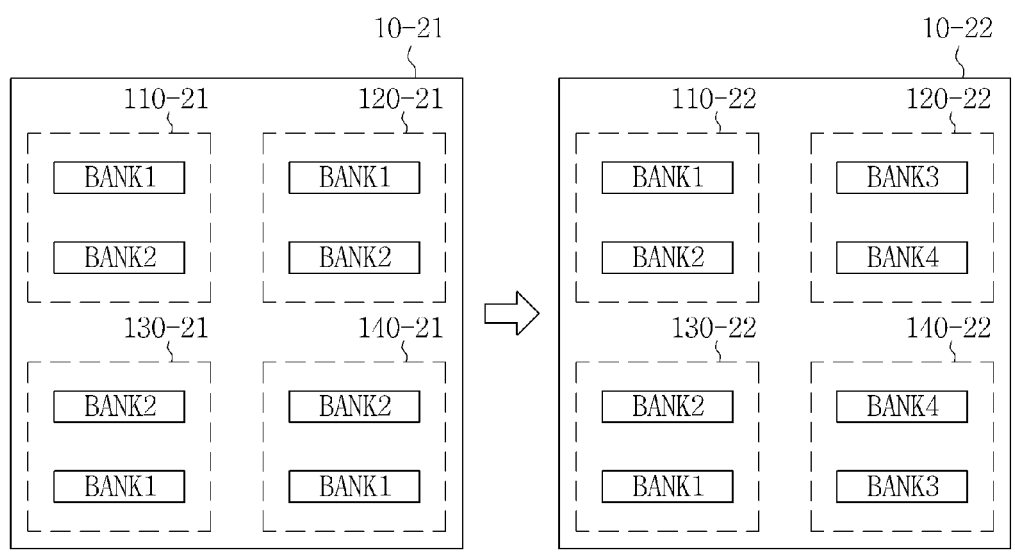

FIGS. 3A and 3B are block diagrams illustrating an exemplary method of testing a semiconductor device using fewer test pads than bump pads. Like in FIG. 2, semiconductor memory devices having a plurality of channels are shown in FIGS. 3A and 3B as exemplary embodiments of a semiconductor device.

In FIG. 3A, a semiconductor memory device 10-11 has four channels 110-11, 120-11, 130-11, 140-11, and each of the channels 110-11, 120-11, 130-11, 140-11 has four banks bank1, bank2, bank3, bank4. When the respective channels 110-11, 120-11, 130-11, 140-11 simultaneously transfer 128-bit data, the semiconductor memory device 10-11 may simultaneously transfer 512-bit data in total. In other words, the semiconductor memory device 10-11 has at least 512 data bump pads dbp for exchanging data among the bump pads bp. Since the bump pads bp have a very small size in the semiconductor memory device 10-11 having μ-bumps as mentioned above, the semiconductor memory device 10-11 may have a large amount of bump pads bp. However, the test pads tp have a much larger size than the bump pads bp, and thus it is difficult to prepare as many test pads tp as the bump pads bp. In other words, it is substantially difficult to match the test pads tp with the bump pads bp on a one-to-one basis. Thus, to significantly reduce the amount of test pads tp as compared with the amount of bump pads bp, exemplary embodiments employ an address mapping technique in which an extended address EADD is used. Using the address mapping technique, a test apparatus 20 can test the semiconductor memory device 10-11 that has the four channels 110-11, 120-11, 130-11, 140-11 and simultaneously receives and outputs 512-bit data in a similar way to a semiconductor memory device 10-12 that has four banks 110-12, 120-12, 130-12, 140-12 and simultaneously receives and outputs 16-bit data.

Table 1 shown below is an address mapping table for the semiconductor memory device 10-11 of FIG. 3A.

TABLE 1

| Bump Pad | Test Pad |
| --- | --- |
| Left/Right Channel | BA1 |
| BA1 | BA0 |
| BA0 | RA12 |
| RA11~0 | RA11~0 |

In Table 1, the "Bump Pad" column shows actual addresses of the semiconductor memory device 10-11, and the "Test Pad" column shows addresses of the mapped semiconductor memory device 10-12 of FIG. 3A.

To overcome the difference between the amount of data bits that can be simultaneously output by the actual semiconductor memory device 10-11 and the amount of data bits that can be simultaneously output by the address-mapped semiconductor memory device 10-12, a test apparatus 20 outputs the extended address EADD as well as an address ADD for selecting a specific memory cell of the actual semiconductor memory device 10-11 to the test data selector 200.

The semiconductor memory device 10-11 in which the respective channels 110-11, 120-11, 130-11, 140-11 simultaneously transfer 128-bit data is shown as an example in FIG. 3A, and only a row address RA12 is added as the extended address EADD in Table 1. Using the address mapping technique, the semiconductor memory device 10-11 having the four channels 110-11, 120-11, 130-11, 140-11 may be tested in a similar way to the semiconductor memory device 10-12 having a single channel and the four banks 110-12, 120-12, 130-12, 140-12. However, each of the banks 110-12, 120-12, 130-12, 140-12 outputs 128-bit data of the corresponding one of the channels 110-11, 120-11, 130-11, 140-11 of the actual semiconductor memory device 10-11, and thus data needs to be selected. The test apparatus 20 may additionally apply a column address, which is the extended address EADD, to the test data selector 200. For example, the extended address EADD of five bits in total may be added by adding 4-bit column addresses CA7, CA8, CA9, CA10 to column addresses CA0, CA1, CA2, CA3, CA4, CA5, CA6 used to select a memory cell in the semiconductor memory device 10-11, so that 16-bit data can be selected and applied to the test pads tp.

Table 2 shown below is an address mapping table for a semiconductor memory device 10-21 of FIG. 3B.

TABLE 2

| Bump Pad | Test Pad |
| --- | --- |
| Channel Selection Signal | BA1 |
| BA1 | BA0 |
| BA0 | RA12 |
| RA11~0 | RA11~0 |

In FIG. 3B, the semiconductor memory device 10-21 has four channels 110-21, 120-21, 130-21, 140-21, and each of the channels 110-21, 120-21, 130-21, 140-21 has two banks bank1, bank2. Like the semiconductor memory device 10-11 of FIG. 3A, the semiconductor memory device 10-21 is address-mapped to a semiconductor memory device 10-22 having a single channel and four banks 110-22, 120-22, 130-22, 140-22. As shown in Table 2, the semiconductor memory device 10-21 of FIG. 3B may test all the memory cells thereof because a bank address BA1 is added as the extended address EADD. However, like in FIG. 3A, each of the banks 110-21, 120-21, 130-21, 140-21 outputs 128-bit data of the corresponding one of the channels 110-21, 120-21, 130-21, 140-21 of the actual semiconductor memory device 10-21, and thus data needs to be selected. Also, the test apparatus 20 may additionally apply a column address, which is the extended address EADD, to the test data selector 200. As described above, the test apparatus 20 may add the extended address EADD of five bits by adding the 4-bit column addresses CA7, CA8, CA9, CA10 to the column addresses CA0, CA1, CA2, CA3, CA4, CA5, CA6 used to select a memory cell in the semiconductor memory device 10-21, so that 16-bit data can be selected and applied to the test pads tp.

In the semiconductor memory device of FIG. 3B, the bank address BA1 and the column addresses CA7, CA8, CA9, CA10 are added as the extended address EADD, while the row address RA12 and the column addresses CA7, CA8, CA9, CA10 are added as the extended address EADD in the semiconductor memory device of FIG. 3A. Here, the extended address EADD may vary according to the settings of the semiconductor memory device. For example, when the column address CA10 is used for another purpose in a semiconductor memory device, the 5-bit column address of the extended address EADD may be set to the column addresses CA7, CA8, CA9 and CA11. Various addresses other than these may also be used as the extended address EADD.

Figure 4:
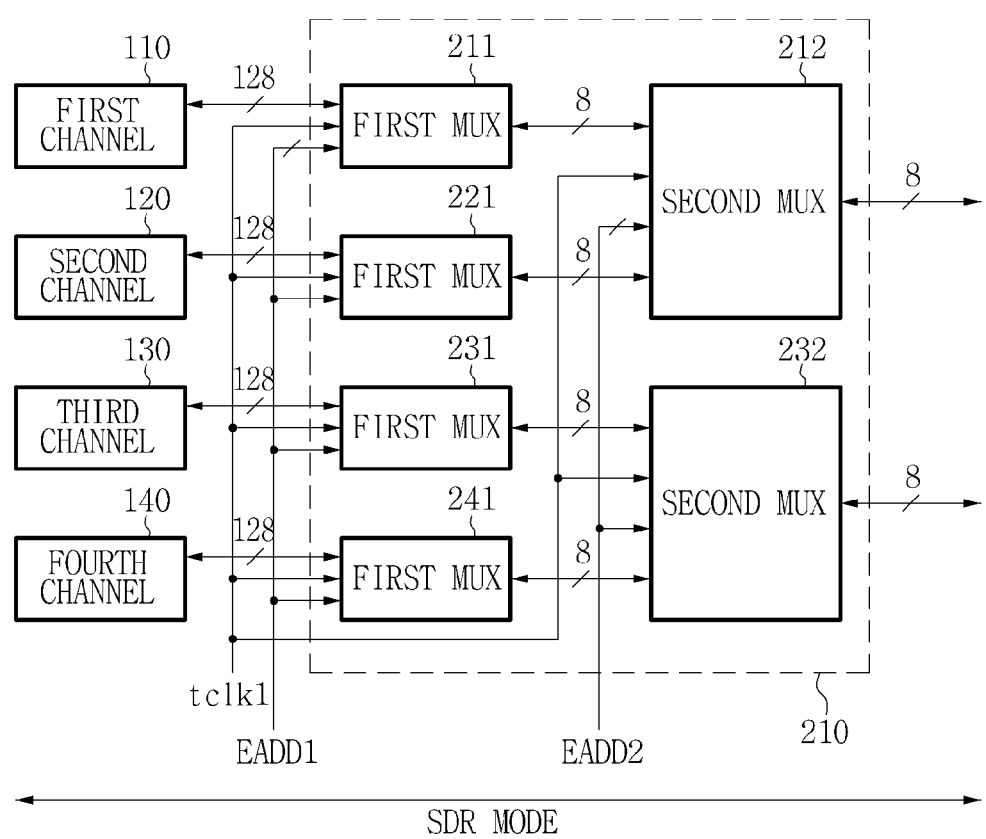
FIG. 4 is a block diagram of an exemplary embodiment of a pad multiplexer (MUX) that outputs data to a test pad using the method of FIG. 3B.

FIG. 4 is a block diagram of an example of a pad MUX that outputs data to a test pad using the method of FIG. 3B. In FIG. 4, the block diagram of FIG. 2 is simplified for convenience, but the pad MUX 210 is illustrated in further detail in comparison with FIG. 2 to describe a process of selecting data output from the respective channels 110, 120, 130, 140.

As described above, the respective channels 110, 120, 130, 140 simultaneously transfer 128-bit data through a plurality of data bump pads dbp in response to read and write commands. Since each of the channels 110, 120, 130, 140 transfers 128-bit data, the amount of the data bump pads dbp is 512 or more.

In the pad MUX 210, a plurality of first MUXs 211, 221, 231, 241 correspond to the channels 110, 120, 130, 140, respectively. Each of the first MUXs 211, 221, 231, 241 receives 128-bit data applied from the corresponding data bump pads dbp in response to the first test clock signal tclk1, selects 8-bit data from among the 128-bit data and outputs the 8-bit data to the corresponding second MUX 212, 232 in response to a first extended address EADD1. Here, the first extended address EADD1 is column addresses CA7, CA8, CA9, CA10 for selecting 8-bit data from among 128-bit data output from each of the channels 110, 120, 130, 140. The second MUXs 212, 232 select one of pieces of 8-bit data applied from the respective first MUXs 211, 221, 231, 241 and output the selected 8-bit data to the corresponding pad buffer 220. In the exemplary embodiment of FIG. 3B, a second extended address EADD2 is the bank address BA1.

As a result, the pad MUX 210 shown in FIG. 4 has the plurality of first MUXs 211, 221, 231, 241 and the plurality of second MUXs 212, 232, the first MUXs 211, 221, 231, 241 select a predetermined amount of pieces of data from among data output from the corresponding channels 110, 120, 130, 140 in response to the first extended address EADD1 and output the selected data, and the second MUXs 212, 232 select a predetermined amount of pieces of data from among the data output from the corresponding first MUXs 211, 221, 231, 241 and output the selected data to the pad buffer 220.

In the pad MUX 210 of FIG. 4, the amount of data bits output from each channel and the amount of data bits output from the first and second MUXs 211, 221, 231, 241, 212, 232 may vary. Alternatively, the first MUXs 211, 221, 231, 241 may also receive the second extended address EADD2 and select data to be output to the pad buffer without the second MUXs 212, 232. In FIG. 4, the same result may be obtained by using the second extended address EADD2 as a signal for activating the first MUXs 211, 221, 231, 241.

It is shown in FIG. 4 that the respective channels 110, 120, 130, 140 of the semiconductor memory device 10 and the pad buffer 220 of the test data selector 200 all operate in a single data rate (SDR) mode. In SDR mode a memory typically can accept one and transfer one word of data per clock cycle. However, the internal circuit 100 and the test data selector 200 may both operate in a double data rate (DDR) mode. In DDR mode there is a doubling of the minimum data rate, e.g., every accept/transfer being at least two consecutive words per clock cycle. The SDR mode illustrated in FIG. 4 also indicates the case where the internal circuit 100 and the test data selector 200 have the same operating speed.

Figure 5:
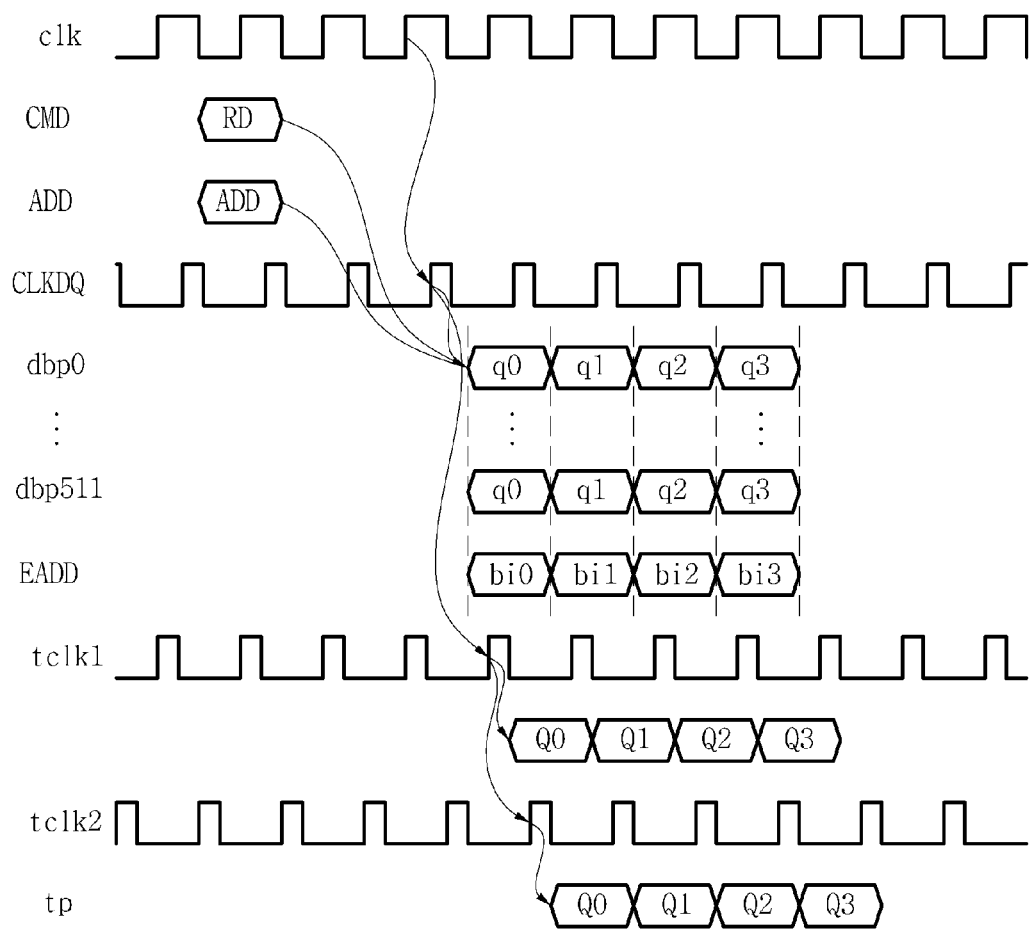
FIG. 5 is a timing diagram illustrating an exemplary test operation of a semiconductor device having a test data selector of FIG. 4.

FIG. 5 is a timing diagram illustrating an exemplary test operation of the semiconductor device 10 having the test data selector 200 of FIG. 4. FIG. 5 also illustrates an exemplary embodiment in which the semiconductor device 10 is a semiconductor memory device.

FIG. 5 will now be described with reference to FIGS. 1A (or 1B), 2, 3B and 4. First, a test apparatus 20 applies the address signal ADD for selecting a memory cell of each channel together with a read command RD to the semiconductor memory device 10. Although FIG. 5 illustrates that the read command RD and the address signal ADD are simultaneously applied, one of the two signals RD and ADD may be applied before or after the other. The internal circuit 100 of the semiconductor device 10 generates the data clock signal CLKDQ in response to a clock signal clk, and outputs data through the plurality of data bumps dbp in response to the read command RD, the address signal ADD, and the data clock signal CLKDQ. Since each channel outputs 128-bit data as described above, the semiconductor memory device 10 having the four channels 110, 120, 130, 140 simultaneously outputs 512-bit data through the 512 data bump pads dbp. Since the semiconductor memory device 10 corresponding to FIG. 5 has a burst length set to 4, each of the 512 data bump pads dbp continuously outputs 4-bit data.

The pad MUX 210 selects 16 pieces of data from among data applied from the 512 data bump pads dbp in response to the first test clock signal tclk1 and the extended address EADD and outputs the 16 pieces of data to the pad buffer 220. The pad buffer 220 outputs the 16 pieces of data applied from the pad MUX 210 to the pad driver 230 in response to the second test clock signal tclk2. The pad driver 230 drives the data applied from the pad MUX 210 and outputs the data to the 16 corresponding test pads tp. In other words, the test data selector 200 according to exemplary embodiments receives 512-bit data simultaneously output from the internal circuit 100 in response to the read command RD, and selectively outputs only 16-bit data among the 512-bit data to the test pads tp in response to the extended address EADD. Thus, it is possible to significantly reduce the amount of the test pads tp. The other data that is not selected by the test data selector 200 may be selected by applying the same address ADD to the internal circuit 100 and changing the extended address EADD.

Figure 6:
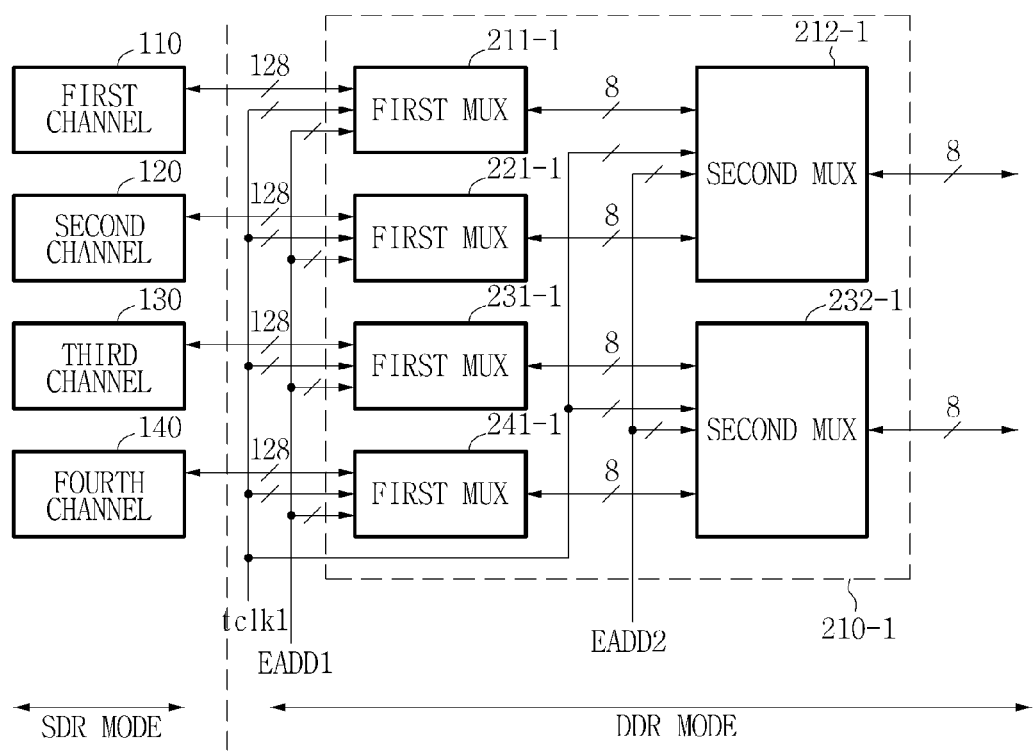
FIG. 6 is a block diagram of an exemplary embodiment of a pad MUX that outputs data to a test pad using the method of FIG. 3B.

FIG. 6 is a block diagram of another exemplary embodiment of a pad MUX that outputs data to a test pad using the method of FIG. 3B.

FIG. 6 is the same as FIG. 4 except that the respective channels 110, 120, 130, 140 of the internal circuit 100 operate in the SDR mode, while a pad MUX 210-1 of the test data selector 200 operates in the DDR mode. In FIG. 6, since the test data selector 200 operates in the DDR mode, while the internal circuit 100 operates in the SDR mode, the operating speed of the test data selector 200 is twice that of the internal circuit 100. Thus, while each of the data bump pads dbp outputs 1-bit data, the test data selector 200 may receive 2-bit data by changing the extended address EADD. Although it is illustrated in FIG. 6 that the internal circuit 100 operates in the SDR mode and the test data selector 200 operates in the DDR mode, the test data selector 200 may operate in a quadruple data rate (QDR) mode when the internal circuit 100 operates in the DDR mode. Alternatively, the internal circuit 100 may operate in the SDR mode, and the test data selector 200 may operate in the QDR mode. In other words, the operating speed of the test data selector 200 is twice or more that of a semiconductor device, so that the test time can be reduced.

Figure 7:
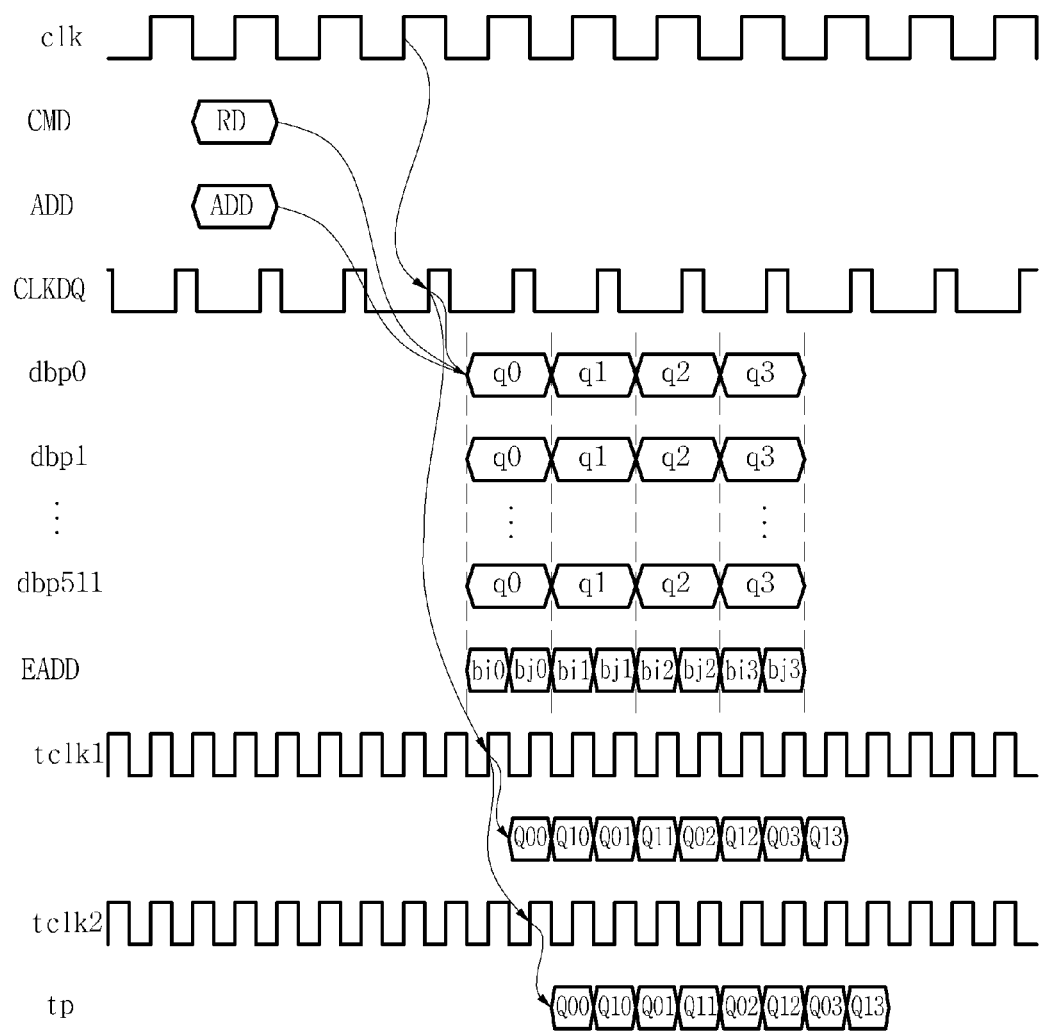
FIG. 7 is a timing diagram illustrating an exemplary test operation of a semiconductor device having a test data selector of FIG. 6.

FIG. 7 is a timing diagram illustrating an exemplary test operation of a semiconductor device having the test data selector 200 of FIG. 6.

Like in FIG. 5, data is output through the plurality of data bump pads dbp of the semiconductor device 10 in response to the address ADD and the read command RD. However, in FIG. 7, the first and second test clock signals tclk1 and tclk2 are toggled at frequencies that are twice the clock signal clk and the data clock signal CLKDQ. And, the extended address EADD is applied at a speed corresponding to the first and second test clock signals tclk1 and tclk2. Thus, the pad MUX 210-1 may select and output data applied from two different data bump pads dbp while each of the data bump pads dbp outputs 1-bit data in response to the first test clock signal tclk1 and the extended address EADD. For this reason, in FIG. 7, 32-bit data may be selected and output to the test pads tp while the internal circuit 100 outputs 512-bit data. On the other hand, in FIG. 5, 16-bit data may be selected and output to the test pads tp. Consequently, the test time can be reduced.

In the description above, the internal circuit 100 of the semiconductor device 10 simultaneously outputs 512-bit data, and the test data selector 200 selects and outputs 16-bit or 32-bit data to the test pads tp. However, the amount of data bits output from the internal circuit 100 and the amount of data bits output from the test data selector 200 may vary according to the amount of the data bump pads dbp and the amount of the test pads tp.

Figure 8:
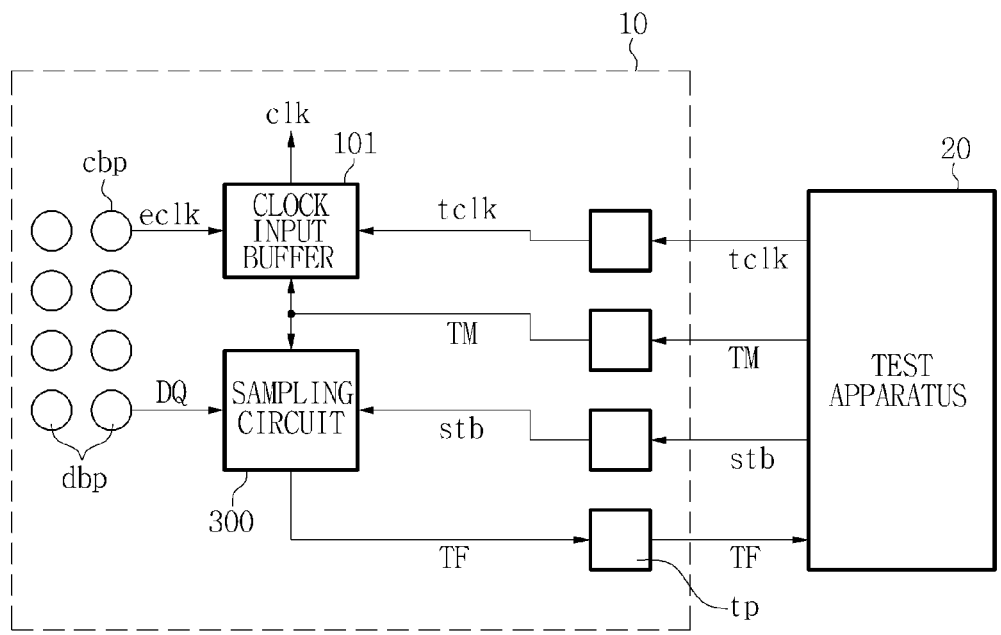
FIG. 8 is a block diagram of only a part of the semiconductor device of FIGS. 1A and 1B for measuring a data output time.

FIG. 8 is a block diagram of only a part of the semiconductor device 10 of FIGS. 1A and 1B for measuring a data output time.

A conventional semiconductor device having μ-bumps transfers data from the internal circuit to the test pads during the wafer test. In other words, data is not transferred through the bump pads. This is because the semiconductor device having μ-bumps exchanges data with the outside through the μ-bumps having a small size, and a data I/O driver has a low data driving capability. Thus, it is difficult for a test apparatus to directly detect data applied through the bump pads bp.

For this reason, the conventional semiconductor device having μ-bumps has an additional driver for testing, which has a high data driving capability and outputs data applied from an internal circuit, and outputs data to test pads during a test. However, an actual semiconductor device having μ-bumps exchanges data with an internal circuit through the μ-bumps. Thus, when data is transferred from the internal circuit to the test pads without passing through the bump pads, the reliability of a test deteriorates.

Consequently, in the semiconductor device 10 according to exemplary embodiments, the test pads tp are configured to receive data through the bump pads bp.

An exemplary method of measuring a data output time of a semiconductor device 10 having μ-bumps will now be described with reference to FIG. 8. In FIG. 8, a clock input buffer 101 is a part of a circuit included in the internal circuit 100. During a normal operation, the clock input buffer 101 receives an external clock signal eclk through a clock bump pad cbp among the bump pads bp in response to the test mode signal TM. During the test operation, the clock input buffer 101 receives the test clock signal tclk applied through a test pad tp from the test apparatus 20, buffers the test clock signal tclk, and outputs the internal clock signal clk used in the internal circuit 100. Here, the test mode signal TM is output from the test apparatus 20 to put the semiconductor device 10 in the test mode. During the test operation, the clock input buffer 101 receives the test clock signal tclk not from the clock bump pad cbp but directly from the test pad tp, as illustrated in FIG. 8. Since the clock input buffer 101 receives the test clock signal tclk directly from the test pad tp, the time taken for the test clock signal tclk to be transferred from the clock bump pad cbp to the clock input buffer 101 via the internal circuit 100 is not included in the data output time tSAC. Consequently, it is possible to measure the accurate data output time tSAC.

Meanwhile, the test apparatus 20 outputs the strobe signal stb together with the test clock signal tclk to the sampling circuit 300 through test pads tp during measurement of the data output time tSAC. At this time, a path through which the strobe signal stb is applied from the test apparatus 20 to the sampling circuit 300 is made to have the same length as a path through which the test clock signal tclk is applied to the clock input buffer 101 as much as possible. This is because the more similar the lengths of a path through which the strobe signal stb is applied and a path through which the test clock signal tclk is applied the more accurate data output time tSAC can be measured. Also, the sampling circuit 300 is disposed as adjacent as possible to a data bump pad dbp, from which sampling data is output, among the data bump pads dbp, from which data is output, included in the bump pads bp. As described above, the data output time tSAC is the time taken for the data output buffer to output applied data to the outside, and thus is measured until the data is output through the bump pads bp. For this reason, the more adjacent the sampling circuit 300 is to the data bump pad dbp from which sampling data is output, the more accurate data output time tSAC can be measured. Furthermore, since data I/O drivers in the internal circuit 100 have a low data driving capability, the sampling circuit 300 is disposed adjacent to the data bump pad dbp from which sampling data is output to readily detect data output through the data bump pads dbp.

The test apparatus 20 outputs the strobe signal stb while adjusting the phase of the strobe signal stb with respect to the test clock signal tclk. For example, the strobe signal stb may be output with the phase adjusted to gradually slow down from the phase of the test clock signal tclk. Although not shown in the drawing, the test apparatus 20 may additionally apply the read command RD to the semiconductor device 10 to measure the data output time tSAC.

In response to the test mode signal TM, the clock input buffer 101 receives the test clock signal tclk applied from the test apparatus 20 through the test pad tp, buffers the test clock signal tclk, and outputs the internal clock signal clk. And, the internal circuit 100 performs a predetermined operation in response to the internal clock signal clk and the read command RD, and outputs data to the data bump pads dbp.

The sampling circuit 300 is activated in the test mode in response to the test mode signal TM, samples data DQ output from the bump pads bp in response to the strobe signal stb, determines whether data is output or not, and outputs a determination signal TF to the test apparatus 20.

The test clock signal tclk and the strobe signal stb are both applied from the test apparatus 20, and thus the test apparatus 20 has information of a delay difference between the two signals. Since the path through which the test clock signal tclk is applied is made similar to the path through which the strobe signal stb, the two signals may be determined to be delayed for approximately the same time on the paths. In other words, by preventing a change in the delay difference caused by the signal transfer paths as much as possible, the delay difference between the test clock signal tclk and the strobe signal stb output from the test apparatus 20 may be determined to be the same as a delay difference between the test clock signal tclk and the strobe signal stb applied to the semiconductor device 10. Also, the test apparatus 20 gradually delays the strobe signal stb for a longer time and outputs the delayed strobe signal stb, and the sampling circuit 300 detects the data DQ output from the data bump pads dbp in response to the strobe signal stb. Consequently, the delay of the strobe signal stb with respect to the test clock signal tclk obtained when the data DQ is first detected may be determined as the data output time tSAC.

Figure 9:
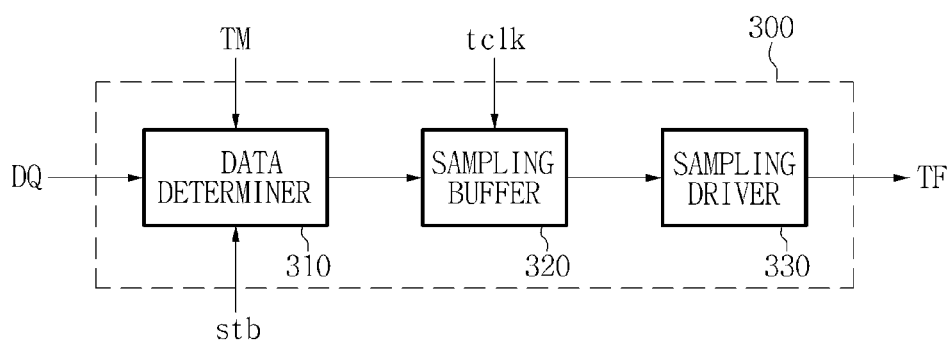
FIG. 9 is a block diagram of an exemplary embodiment of a sampling circuit of FIG. 8.

FIG. 9 is a block diagram of an exemplary embodiment of the sampling circuit 300 of FIG. 8. The sampling circuit 300 has a data determiner 310, a sampling buffer 320, and a sampling driver 330.

The data determiner 310 is a circuit that is activated in response to the test mode signal TM and determines whether or not data is output by sampling data in response to the strobe signal stb. The data determiner 310 may have an input buffer (not shown) to readily detect the data DQ output from the data bump pads dbp, and additionally have a switch circuit that is turned on or off in response to the test mode signal TM to prevent an unnecessary load from being applied to the data DQ output from the data bump pads dbp during a normal operation.

The sampling buffer 320 and the sampling driver 330 drive the determination signal TF output from the data determiner 310 with a high driving capability and output the determination signal TF so that the test apparatus 20 can readily detect the determination signal TF. A transfer path between the sampling circuit 300 and a test pad tp from which the determination signal TF is output does not have an influence on the reliability of a test. In other words, since the sampling circuit 300 adjacent to the data bumps dbp detects data, determines whether or not data is output at a point in time where the strobe signal stb is activated, and outputs only the determination result to the test apparatus 20 through the test pad tp, an accurate test is enabled. Also, data output through the bump pads bp is detected, and thus it is possible to improve the reliability of a test.

Figure 10:
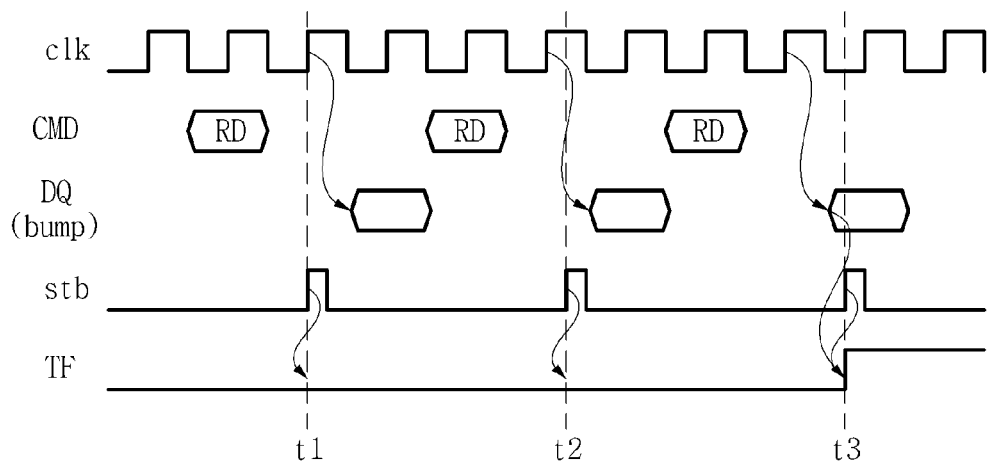
FIG. 10 is a timing diagram illustrating an exemplary method of measuring a data output time of a semiconductor device according to exemplary embodiments.

FIG. 10 is a timing diagram illustrating an exemplary method of measuring the data output time of a semiconductor device according to an exemplary embodiment of the present inventive concept.

As illustrated in FIG. 10, the test apparatus 20 applies the test clock signal tclk to the semiconductor device 10. Subsequently, the read command RD is applied, and then the strobe signal stb is applied to the sampling circuit 300. At the initial stage of a test, the test apparatus 20 may output the strobe signal stb with the same phase as the clock signal clk. When the determination signal TF applied from the sampling circuit 300 indicates that data is not detected, the strobe signal stb may be output with a phase that is delayed for a predetermined time (e.g., 10 ns) compared with the test clock signal tclk, and then is output with a phase gradually delayed for a longer time. Here, the delay of the strobe signal stb may vary. At a point in time t3 in FIG. 10, the determination signal TF indicates that data is detected, and the test apparatus 20 may determine a current delay difference between the test clock signal tclk and the strobe signal stb as the data output time tSAC.

Figure 11:
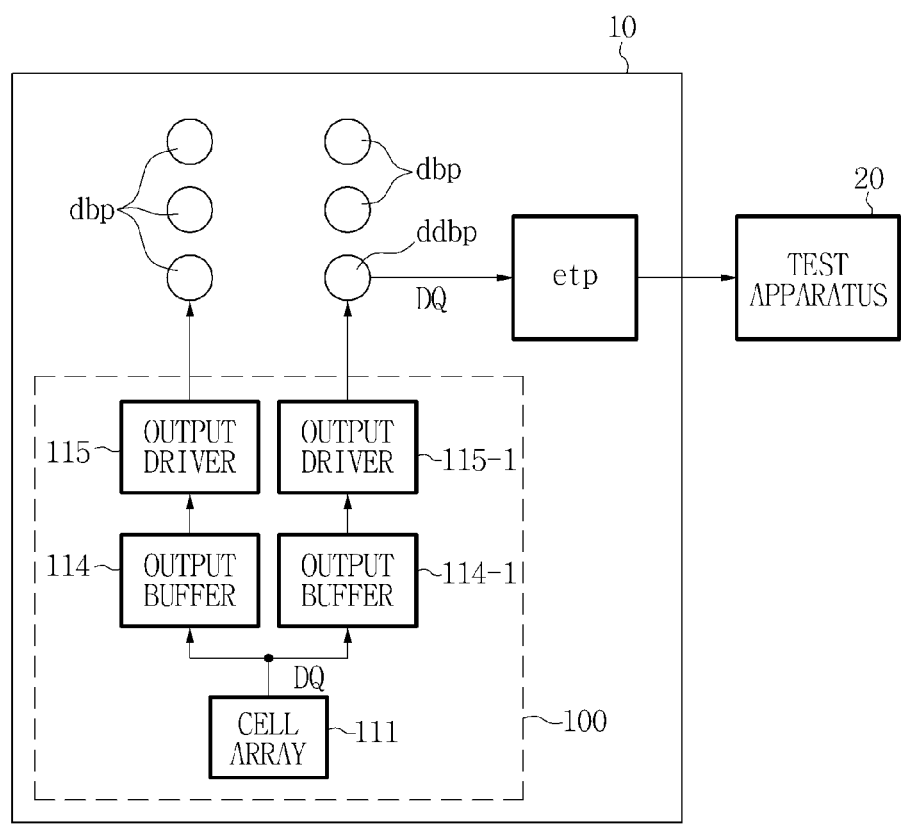
FIG. 11 is a block diagram of only a part of the semiconductor device of FIGS. 1A and 1B for an input/output (I/O) buffer information specification (IBIS) test.

FIG. 11 is a block diagram of only a part of the semiconductor device 10 of FIGS. 1A and 1B for an IBIS test.

As shown in FIG. 11, the semiconductor device 10 according to an exemplary embodiment has the at least one dummy bump pad ddbp among the data bump pads dbp to perform an IBIS test. The dummy bump pad ddbp prepared for an IBIS test is configured to receive the same data as one of the data bump pads dbp. Also, the semiconductor device 10 is disposed adjacent to the dummy bump pad, and has the extended test pad etp directly connected to the dummy bump pad ddbp. In FIGS. 1A and 1B, the dummy bump pads ddbp are disposed at the same position, but the disposition of the dummy bump pads ddbp may vary. In FIG. 11, the internal circuit 100 outputs data stored in the cell array 111 to the dummy bump pad ddbp through the same path as the data output to the data bump pads dbp, and output buffers 114, 114-1 and output drivers 115, 115-1 correspond to the data bump pads dbp and the dummy bump pad ddbp, respectively. However, the output buffers 114, 114-1 and the output drivers 115, 115-1 may be used in common.

As mentioned above, voltage-current (VI) and voltage-time (VT) of a digital I/O pin are measured in an IBIS test. Thus, the extended test pad etp is directly connected to the dummy bump pad ddbp, and disposed as adjacent as possible to the dummy bump pad ddbp to improve the reliability of the test. Since the extended test pad etp is directly connected to the dummy bump pad ddbp, an additional driver for data output from the dummy bump pad ddbp cannot be prepared between the dummy bump pad ddbp and the extended test pad etp. For this reason, the extended test pad etp is miniaturized as much as possible to minimize a measurement error caused by the extended test pad during an IBIS test while enabling the extended test pad etp to be probed with a probe. The test pads tp other than the extended test pad etp also are miniaturized as much as possible to reduce the size of the semiconductor device 10 while enabling the test pads tp to be probed with a probe.

The test apparatus 20 measures voltage-current (VI) and voltage-time (VT) of a signal output from the extended test pad etp by probing the extended test pad etp, thereby performing an IBIS test. As in a test for the data output time tSAC, the semiconductor device 10 according to the exemplary embodiment measures a signal output to the extended test pad etp through the dummy bump pad ddbp during the IBIS test, so that the reliability of the test can be improved.

Figure 12:
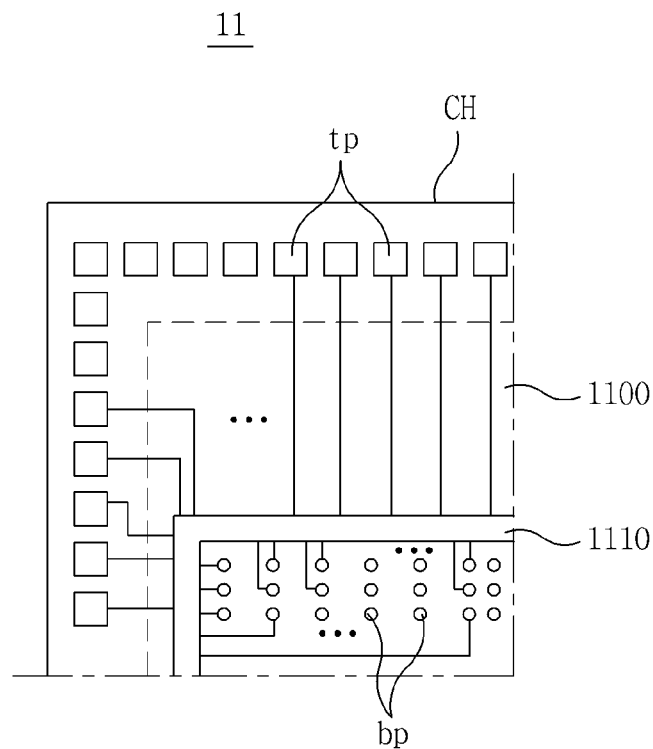
FIG. 12 is a block diagram of a semiconductor device according to an exemplary embodiment.

FIG. 12 is a block diagram of a semiconductor device according to an exemplary embodiment in which only a part of the semiconductor device is shown for convenience.

In the exemplary embodiment shown in FIG. 12, a semiconductor device 11 has one chip CH, and only a part of the chip CH is shown, unlike FIGS. 1A and 1B. However, other exemplary embodiments of the semiconductor device 11 may have a plurality of chips.

Referring to FIG. 12, which is similar to FIG. 1A, the chip CH of the semiconductor device 11 has an internal circuit 1100, a delay adjuster 1110, a plurality of bump pads bp, and a plurality of test pads tp.

A multi-stack semiconductor device can be implemented by stacking a plurality of chips after testing the respective chips. However, operating characteristics obtained by testing the respective chips may be different from operating characteristics of the multi-stack semiconductor device obtained after the chips are stacked. To supplement such a difference in characteristics, the multi-stack semiconductor device also performs a test after the plurality of chips are stacked. Conventionally, an additional test chip is used to test the multi-stack semiconductor device in the same environment as a mounting environment.

In the mounting environment, the multi-stack semiconductor device receives data and a signal through a plurality of bumps at a designated timing. A multi-stack semiconductor device can be directly stacked on another semiconductor device and receive and output data and a signal. To test a semiconductor device in the same environment as such a mounting environment, the additional test chip functions to adjust the timing of data and various signals applied from a test apparatus through a bump of one chip of a stacked or a plurality of chips, and to apply the data and signals.

The semiconductor device 11 according to the exemplary embodiment shown in FIG. 12 can perform a test in the same environment as a mounting environment without additionally using a test chip.

Functions of the internal circuit 1100, the plurality of bump pads bp, and the plurality of test pads tp are the same as those described with reference to FIG. 1A, and the description will not be reiterated.

The delay adjuster 1110 delays respective pieces of data and respective signals applied through the plurality of test pads tp for different time periods and then applies the delayed pieces of data and the delayed signals to the plurality of bump pads bp. The delay adjuster 1110 may be included in the internal circuit 1100.

As mentioned above, the plurality of bump pads bp and the plurality of test pads tp may have a difference in size and may be disposed at various positions. Thus, distances between the plurality of bump pads bp and the plurality of test pads tp corresponding to the respective bump pads bp may not be the same. In other words, the distances between the plurality of bump pads bp and the plurality of corresponding test pads tp may be different according to the disposition of the bump pads bp and the test pads tp.

For this reason, when a test apparatus performs a test by inputting and outputting data and various signals through the test pads tp rather than by inputting and outputting data and various signals through the bump pads bp using a test chip, a difference in data transfer delay may occur due to a difference in distance between the plurality of bump pads bp and the plurality of corresponding test pads tp, and thus an error may occur in the test. In particular, a semiconductor device inputting and outputting data at high speed would have a high probability of error.

Thus, the delay adjuster 1110 according to exemplary embodiments of the present inventive concept delays data and signals applied through the plurality of test pads tp for different time periods to reduce the difference in data transfer delay, such that test errors can be prevented when not using a test chip. In the exemplary embodiments, the delay adjuster 1110 may be interposed between the plurality of bump pads bp and the plurality of test pads tp.

Figure 13:
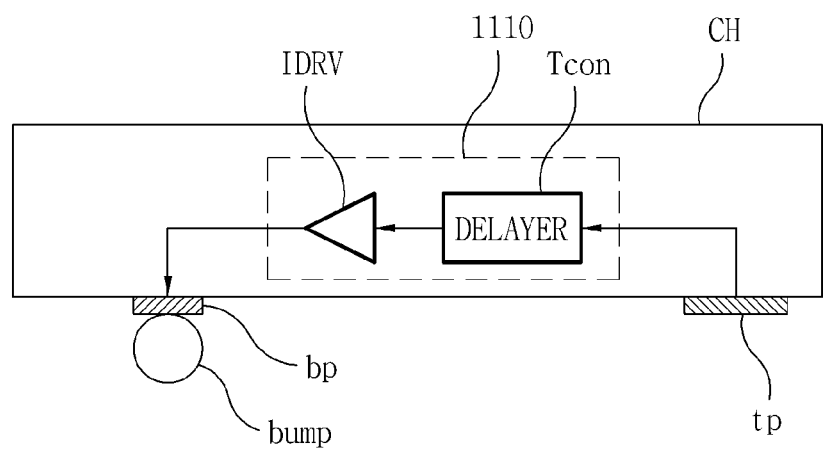
FIG. 13 illustrates an example of the operation of a delay adjuster of FIG. 12.

FIG. 13 illustrates an example of the operation of the delay adjuster 1110 of FIG. 12, in which data and a signal are applied to the bump pad bp through the test pad tp.

In FIG. 13, the delay adjuster 1110 has a delayer Tcon and an input driver IDRV between each test pad tp and the corresponding bump pad bp. The delayer Tcon delays data or a signal applied through the test pad tp for a predetermined time period, and the input driver IDRV applies the data or signal delayed by the delayer Tcon to the corresponding bump pad bp. However, in an exemplary embodiment the input driver IDRV may be omitted, wherein the bump pad bp may directly receive data or a signal applied from the delayer Tcon. The bump pad bp is electrically connected with the internal circuit 1100 and applies the data or signal applied through the delay adjuster 1110 to the internal circuit 1100. Here, a time for which the delayer Tcon delays the data or signal is set to correspond to a distance between the test pad tp and the corresponding bump pad bp. For example, in the semiconductor device according to the exemplary embodiments, the delay adjuster 1110 designates one signal among data and signals applied through the test pads tp as a reference signal and adjusts the delays of the respective delayers Tcon so that signals applied to the plurality of test pads tp can be applied to the corresponding bump pads bp at the same time as the reference signal.

However, when the distances between the delay adjuster 1110 and the bump pads bp are long, a delay difference may occur again while data or signals respectively output from the plurality of delayers Tcon of the delay adjuster 1110 are transferred to the bump pads bp. Thus, when data or a signal is applied from a test apparatus to the semiconductor device 11, the delay adjuster 1110 may be disposed adjacent to the bump pads bp as shown in FIG. 12 so that the pieces of data or signals output from the delay adjuster 1110 can be applied to the plurality of bump pads bp at as similar a time as possible.

Figure 14:
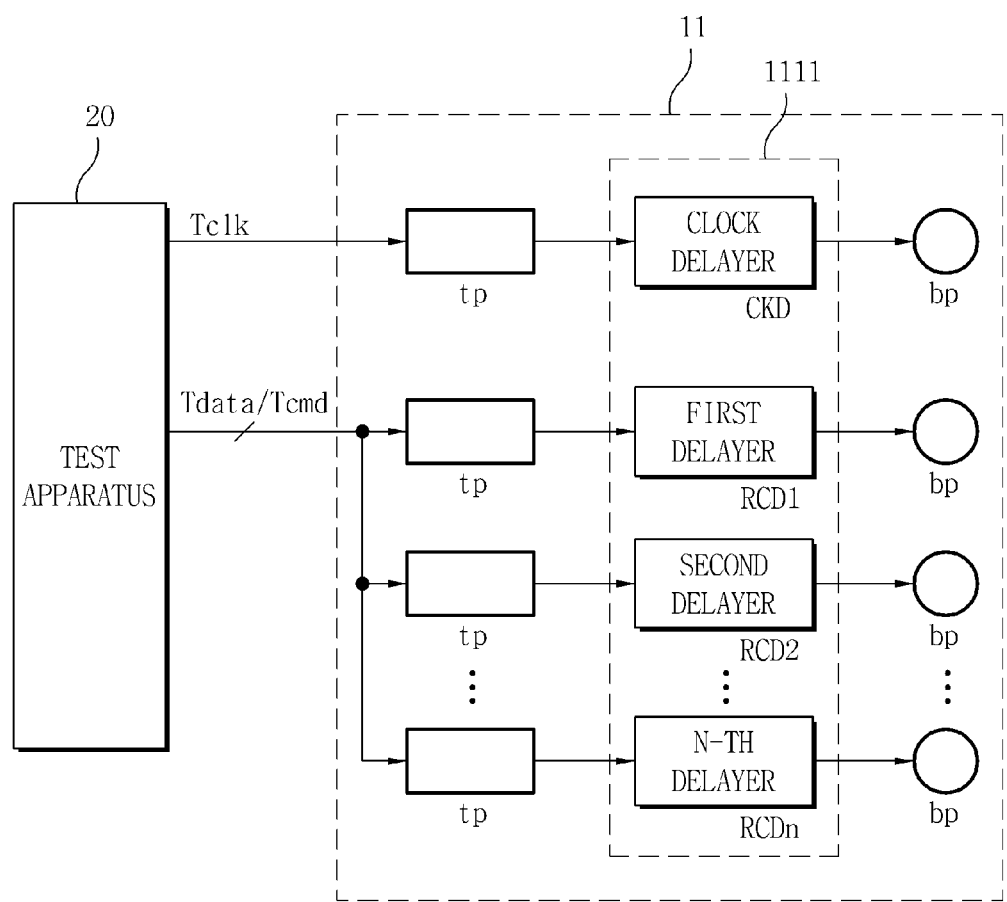
FIGS. 14, 15 and 16 illustrate test systems having the semiconductor device of FIGS. 12 and 13.
Figure 15:
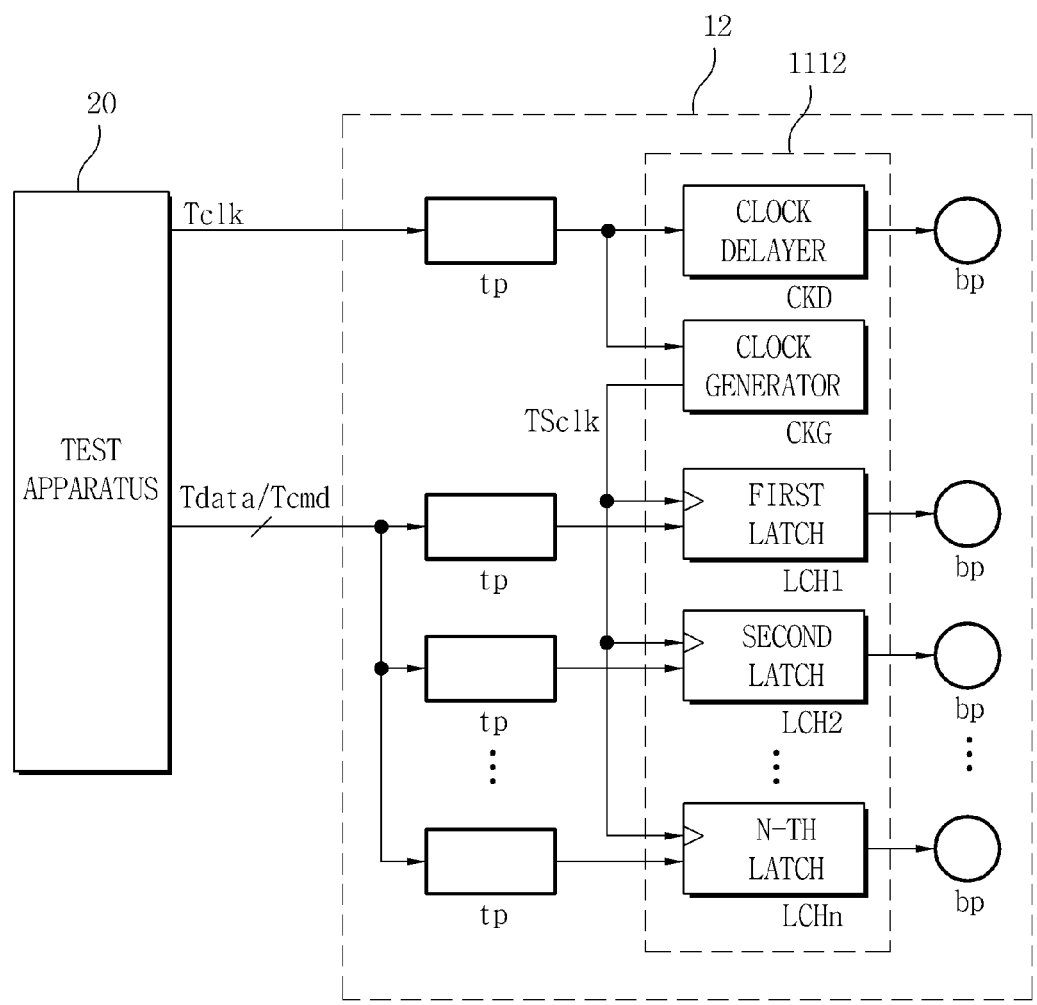
Figure 16:
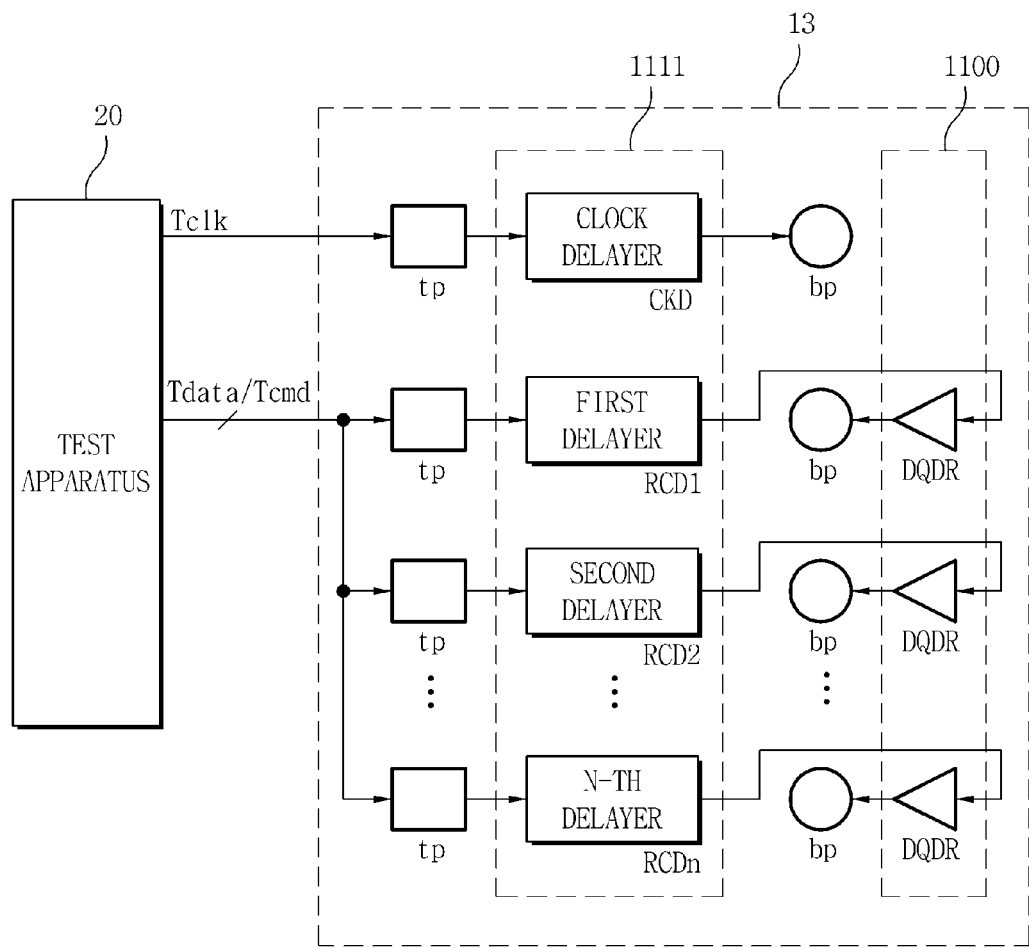

FIGS. 14 to 16 illustrate test systems having the semiconductor device of FIGS. 12 and 13.

In FIG. 14, a test apparatus 20 applies test data including a clock signal Tclk, data Tdata, and a command Tcmd to the semiconductor device 11 through the test pads tp.

Since most semiconductor devices, in particular, synchronous semiconductor devices, use the clock signal Tclk as a reference signal for data and signal synchronization, in the exemplary embodiment of the test system of FIG. 14 the clock signal Tclk is used as the reference signal. Since the clock signal Tclk is set as the reference signal, the data Tdata and the command Tcmd need to be applied to the bump pads bp in synchronization with the clock signal Tclk. However, when the clock signal Tclk is applied earlier than the data Tdata and the command Tcmd, the data Tdata and the command Tcmd can't be delayed and synchronized with the clock signal Tclk.

Thus, the clock signal Tclk needs to be delayed for a predetermined time period to be applied to the bump pad bp later than the data Tdata and the command Tcmd which are applied to the bump pads bp without being delayed by a plurality of delayers RCD1, RCD2, . . . RCDn. A clock delayer CKD of the delay adjuster 1111 delays the clock signal Tclk applied through the test pad tp for the predetermined time period and outputs a delayed clock signal Tclk. The time period for which the clock delayer CKD delays the clock signal Tclk may be determined by simulation or by actually applying the clock signal Tclk, the data Tdata, and the command Tcmd to the semiconductor device 11 and measuring the delays of the respective signals.

The respective delayers RCD1, RCD2, . . . RCDn of the delay adjuster 1111 delay the data Tdata or the command Tcmd applied through the corresponding test pads tp for different time periods and output the delayed data Tdata or the delayed command Tcmd to the corresponding bump pads bp. As mentioned above, distances and connection paths between the plurality of test pads tp and the corresponding bump pads bp may not be the same. Thus, in FIG. 14, the plurality of delayers RCD1, RCD2, . . . RCDn delay the data Tdata or the command Tcmd for different time periods and apply the delayed data Tdata or the delayed command Tcmd to the bump pads bp. The respective delayers RCD1, RCD2, . . . RCDn delay the data Tdata or the command Tcmd so that the data Tdata or the command Tcmd is applied to the bump pads bp in synchronization with the clock signal Tclk set as the reference signal. The delays of the respective delayers RCD1, RCD2, . . . RCDn may be determined by simulation or by actually measuring delays, like the clock signal Tclk.

In FIG. 14, the plurality of delayers RCD1, RCD2, . . . RCDn may use various delay circuits such as resistance/capacitance (RC) delay circuits or inverter delay circuits. Variable delay devices, such as voltage variable transistor-transistor logic (TTL) delay lines, may also be used as needed.

As a result, the semiconductor device 11 shown in FIG. 14 can delay the clock signal Tclk among the test data applied from the test apparatus 20 for the predetermined time period to receive the delayed clock signal Tclk through the bump pad bp, and can receive the data Tdata or the command Tcmd among the test data through the bump pads bp in synchronization with the clock signal Tclk. Consequently, although the test apparatus 20 applies test data to the semiconductor device 11 through the test pads tp, it is possible to perform a test in an environment similar to the mounting environment.

The test system of FIG. 15 is the same as that of FIG. 14 except for the structure of a delay adjuster 1112. Like the delay adjuster 1111 of FIG. 14, the delay adjuster 1112 of FIG. 15 also has a clock delayer CKD to delay the clock signal Tclk for a predetermined time period and apply the delayed clock signal Tclk to the bump pad bp. However, the delay adjuster 1112 of FIG. 15 additionally has a clock generator CKG. The clock generator CKG receives the clock signal Tclk through the corresponding test pad tp and outputs a synchronization clock signal TSclk for synchronizing the data Tdata or the command Tcmd.

A plurality of latches LCH1, LCH2, . . . LCHn latch the data Tdata or the command Tcmd applied through the corresponding test pads tp, and output the latched data Tdata or the latched command Tcmd to the corresponding bump pads bp respectively in response to the synchronization clock signal TSclk.

While the plurality of delayers RCD1, RCD2, . . . RCDn in the delay adjuster 1111 of FIG. 14 need to individually adjust delays to have different delays, the delay adjuster 1112 of FIG. 15 latches the data Tdata or the command Tcmd and simultaneously outputs the latched data Tdata or the latched command Tcmd to the bump pads bp in response to the synchronization clock signal TSclk generated by the clock generator CKG, thereby resulting in an effect similar to that of the delay adjuster 1111 of FIG. 14.

According to the disposition of the plurality of latches LCH1, LCH2, . . . LCHn, timings at which the synchronization clock signal TSclk output from the clock generator CKG is applied may not be exactly the same. However, in comparison with distances between the test pads tp and the delay adjuster 1112, distances between the clock generator CKG and the plurality of latches LCH1, LCH2, . . . LCHn are very short, and thus the difference in time taken for the synchronization clock signal TSclk to be applied to the plurality of latches LCH1, LCH2, . . . LCHn can be ignored.

When the plurality of latches LCH1, LCH2, . . . LCHn latch the data Tdata or the command Tcmd in response to the clock signal Tclk output from the clock delayer CKD and output the delayed data Tdata or the delayed command Tcmd to the corresponding bump pads bp, the data Tdata or the command Tcmd may not be synchronized with the clock signal Tclk due to the transfer time for the clock signals Tclk output from the clock delayer CKD to the plurality of latches LCH1 to LCHn. Thus, unlike the delay adjuster 1111 of FIG. 14, the delay adjuster 1112 of FIG. 15 generates the synchronization clock signal TSclk whose phase precedes that of the clock signal Tclk output from the clock delayer CKD and transfers the synchronization clock signal TSclk to the plurality of latches LCH1, LCH2, . . . LCHn. However, when the delay of the clock signal Tclk output from the clock delayer CKD is very short, the clock signal Tclk output from the clock delayer CKD may be directly applied to the plurality of latches LCH1, LCH2, . . . LCHn without the clock generator CKG.

In the test system of FIG. 16, a semiconductor device 13 has the same delay adjuster 1111 as shown in FIG. 14. However, the semiconductor device 13 of FIG. 16 does not directly apply the data Tdata or the command Tcmd output from the plurality of delayers RCD1, RCD2, . . . RCDn to the bump pads bp but applies the data Tdata or the command Tcmd to the bump pads bp through output drivers DQDR provided in the internal circuit 1100. Most of the bump pads bp are not used for only data input or data output but are used for the both of data input and data output. Thus, the bump pads bp are electrically connected to the output drivers DQDR and input drivers (not shown) of the internal circuit 1100. The semiconductor device 13 of FIG. 16 applies the data Tdata or the command Tcmd output from the plurality of delayers RCD1, RCD2, . . . RCDn to the bump pads bp through the output drivers DQDR of the internal circuit 1100. The data Tdata or the command Tcmd applied to the bump pads bp is then applied to the internal circuit 1100 through the input drivers (not shown).

Although not shown in the drawings, the bump pads of FIGS. 14 and 15 also may be electrically connected to the input drivers and the output drivers of the internal circuit 1100. Like the delay adjuster 1110 of FIG. 13, the delay adjusters 1111, 1112 of FIGS. 14 and 15 may have an input driver IDRV for driving the data Tdata or the command Tcmd output from the plurality of delayers RCD1, RCD2, . . . RCDn or the plurality of latches LCH1, LCH2, . . . LCHn, and applying the data Tdata or the command Tcmd to the corresponding bump pads bp.

In FIG. 16, the semiconductor device 13 has the same delay adjuster 1111 as shown in FIG. 14, but may have the delay adjuster 1112 of FIG. 15.

Figure 17:
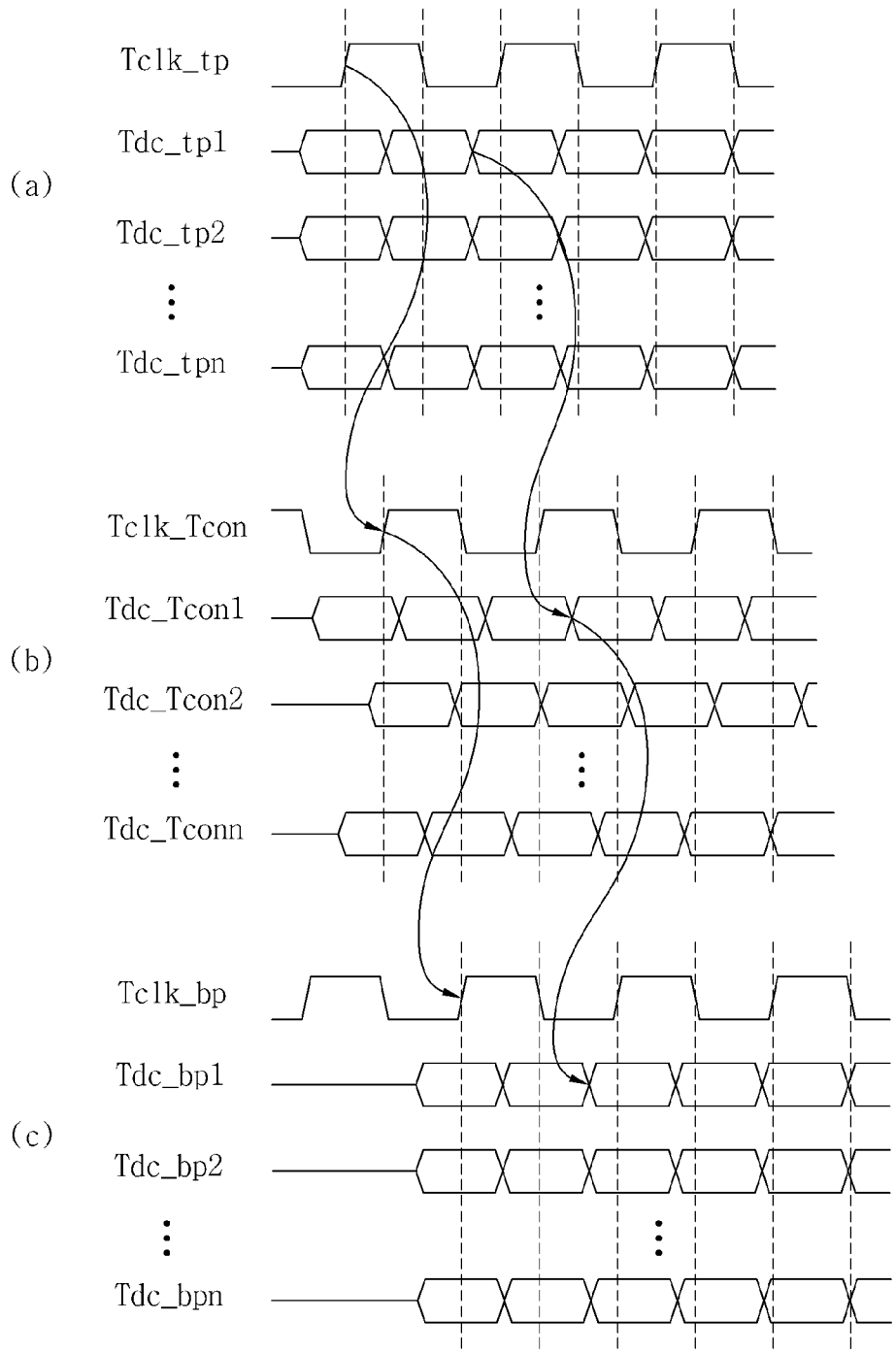
FIG. 17 is a timing diagram illustrating the operation of the test systems of FIGS. 14 to 16.

FIG. 17 is a timing diagram illustrating the operation of the test systems of FIGS. 14 to 16.

Portion (a) of FIG. 17 illustrates a clock signal Tclk_tp and data or a command Tdc_tp1, Tdc_tp2, . . . Tdc_tpn applied to test pads tp. Portion (b) of FIG. 17 illustrates a clock signal Tclk_Tcon and data or a command Tdc_Tcon1, Tdc_Tcon2, . . . Tdc_Tconn applied to the delay adjuster 1110, 1111 or 1112. Portion (c) of FIG. 17 illustrates a clock signal Tclk_bp and data or a command Tdc_bp1, Tdc_bp2, . . . Tdc_bpn applied to bump pads bp.

As illustrated in portion (a), when the clock signal Tclk and the data Tdata or the command Tcmd are applied from the test apparatus 20 to the semiconductor device 11, the clock signal Tclk_tp and the data or command Tdc_tp1, Tdc_tp2, . . . Tdc_tpn at the test pads tp are in synchronization with each other. However, while the clock signal Tclk_tp and the data or command Tdc_tp1, Tdc_tp2, . . . Tdc_tpn output from the test pads tp are transferred to the delay adjuster 1110, the clock signal Tclk_tp and the data or command Tdc_tp1, Tcd_tp2, . . . Tdc_tpn are delayed for different time periods according to respective paths, and the clock signal Tclk_Tcon and the data or command Tdc_Tcon1, Tdc_Tcon2, . . . Tdc_Tconn are applied to the delay adjuster 1110 in asynchronization with each other as illustrated in portion (b).

However, the delay adjuster 1110 delays the non-synchronized clock signal Tclk_Tcon and the non-synchronized data or command Tdc_Tcon1, Tdc_Tcon2, . . . Tdc_Tconn for different time periods, thereby outputting the synchronized clock signal Tclk_bp and the synchronized data or command Tdc_bp1, Tdc_bp2, . . . Tdc_bpn to the bump pads bp. Thus, the internal circuit 1110 receiving the clock signal Tclk_bp and the data or command Tdc_bp1, Tdc_bp2, . . . Tdc_bpn through the bump pads bp can perform a test without malfunction.

Consequently, as illustrated in FIG. 17, the delay adjuster 1110 in the semiconductor device according to the exemplary embodiment synchronizes the clock signal Tclk with the data Tdata or the command Tcmd, which are delayed for different time periods and applied from the test pads tp, and applies the synchronized clock signal Tclk and the synchronized data Tdata or the synchronized command Tcmd to the bump pads bp. Thus, the reliability of the testing can be improved.

Figure 18:
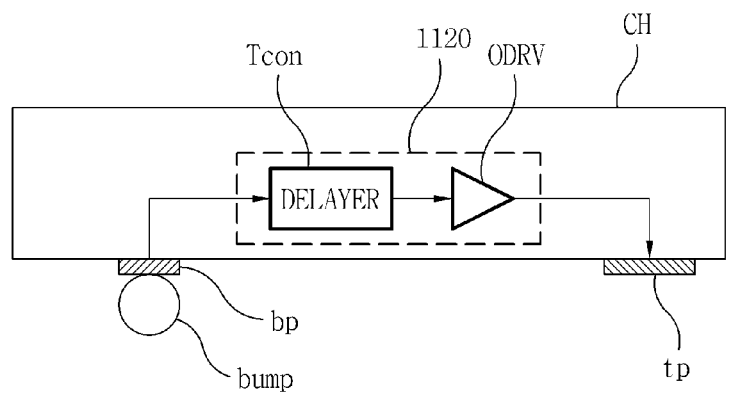
FIG. 18 illustrates another example of the operation of the delay adjuster of FIG. 12.

FIG. 18 illustrates another example of the operation of the delay adjuster of FIG. 12.

The previously described semiconductor device of FIG. 13 synchronizes the clock signal Tclk with the data Tdata or the command Tcmd applied to the bump pad bp when data is input to the bump pad bp by way of the test pad tp. On the other hand, unlike the delay adjuster 1110 of FIG. 13, a delay adjuster 1120 of FIG. 18 synchronizes the data Tdata or the command Tcmd with the clock signal Tclk applied to the test pad tp when data is output from the bump pad bp to the outside through the test pad tp. Thus, the delay adjuster 1120 of FIG. 18 has an output driver ODRV instead of the input driver IDRV. However, like the input driver IDRV, in an exemplary embodiment the output driver ODRV may also be omitted. The delay adjuster 1120 of FIG. 18 may be disposed adjacent to the test pad tp to apply the synchronized clock signal Tclk and the synchronized data Tdata or the synchronized command Tcmd to the test pad tp.

In the exemplary embodiments depicted in the drawings, the semiconductor device 11 has only one of the delay adjuster 1110 for data input and the delay adjuster 1120 for data output, but an exemplary embodiment may have both of the input delay adjuster 1110 and the output delay adjuster 1120.

The delay adjuster 1120 of FIG. 18 may be replaced by the test data selector 200 shown in FIG. 2. Since the test data selector 200 shown in FIG. 2 not only selects a piece of test data to be output from among a plurality of pieces of test data but also outputs the test data applied through the data bump pads dbp to the corresponding test pad tp in synchronization with the test clock signals tclk1, tclk2, the test data selector 200 can perform a similar function to that of the delay adjuster 1120 of FIG. 18.

Figure 19:
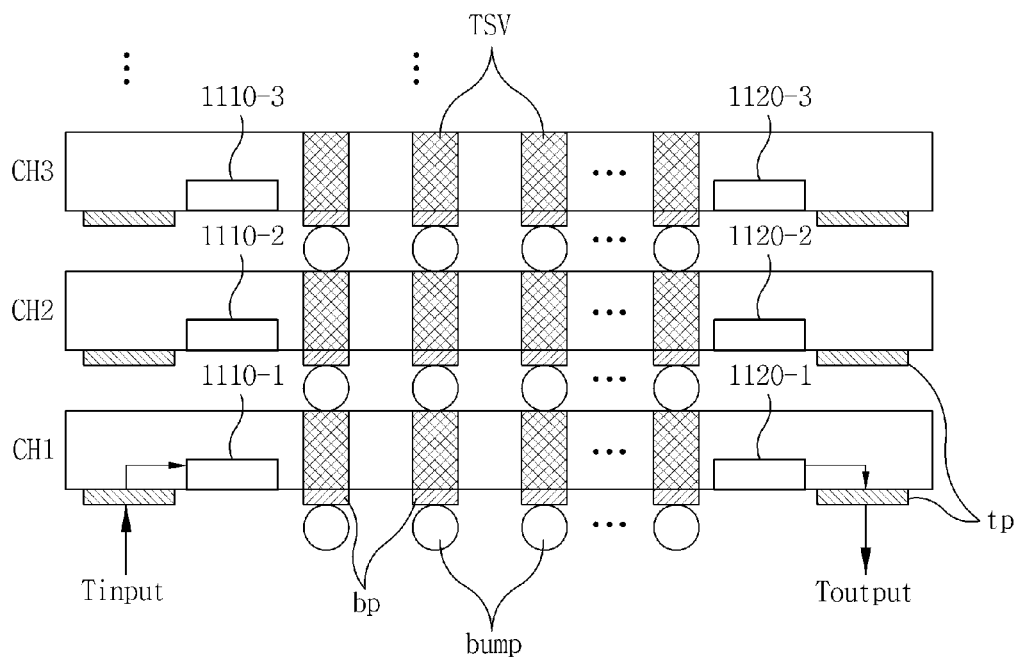
FIG. 19 illustrates a method of testing a multi-stack semiconductor device according to an exemplary embodiment.

FIG. 19 illustrates a method of testing a multi-stack semiconductor device according to an exemplary embodiment. Each of stacked chips CH1, CH2, CH3, . . . has both of the delay adjuster of FIG. 13 and the delay adjuster of FIG. 18. Even in the multi-stack semiconductor device in which the plurality of chips CH1, CH2, CH3, . . . are stacked, only one chip CH1 may exchange data with the test apparatus 20 through a test pad tp. FIG. 19 illustrates the case in which only the first chip CH1 receives data Tinput from the test apparatus 20. A delay adjuster 1110-1 of the first chip CH1 delays the pieces of data Tinput applied through the test pad tp for different time periods and applies the delayed pieces of data Tinput to the corresponding bump pads bp in synchronization with each other. Also, a delay adjuster 1120-1 of the first chip CH1 delays pieces of data Toutput applied through the corresponding bump pads bp for different time periods and applies the delayed pieces of data Toutput to the corresponding test pad tp in synchronization with each other. Thus, even if the test apparatus 20 receives and outputs the data Tinput and Toutput through test pads tp other than bump pads bp, a test can be performed in an environment similar to the mounting environment.

The delay adjuster 1110-1 for the input data Tinput is an input delay adjuster, and the delay adjuster 1120-1 for the output data Toutput is an output delay adjuster.

Figure 20:
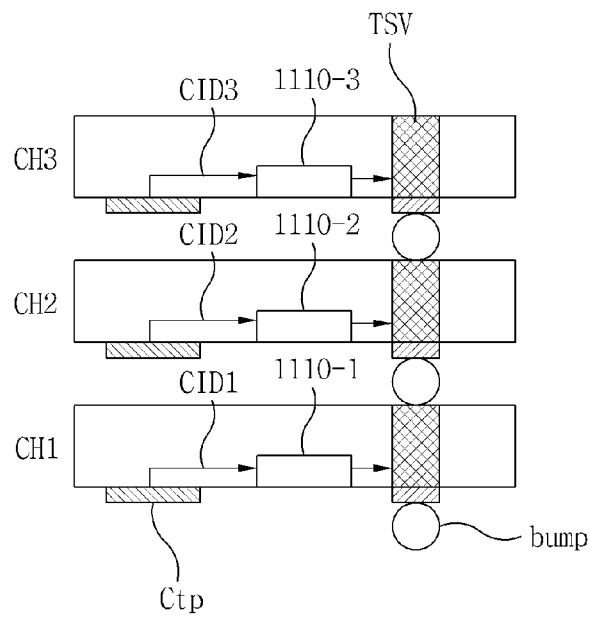
FIG. 20 illustrates a method of testing a multi-stack semiconductor device according to an exemplary embodiment.

FIG. 20 illustrates a method of testing a multi-stack semiconductor device according to an exemplary embodiment.

In the multi-stack semiconductor device, as mentioned above, the chips CH2, CH3 other than the one chip CH1 generally cannot exchange data with the test apparatus 20 through the test pad tp. Thus, the delay adjusters 1110-2, 1110-3 of the stacked chips CH2, CH3 are not used. However, when the delay adjusters 1110-2, 1110-3 are connected to the bump pads bp even if not used, a load increases during a normal operation as well as during a test operation, and the driving capability of an I/O driver provided in the internal circuit 1100 can deteriorate. Thus, in FIG. 20, one chip is selected using chip identification (ID) numbers CID1, CID2, CID3 of the stacked chips CH1, CH2, CH3, and only the delay adjuster 1110-1 of the selected chip is used, so that the unused delay adjusters 1110-2, 1110-3 can be deactivated. A method of selecting one of the stacked chips CH1, CH2, CH3 using the chip ID numbers CID1, CID2, CID3 may employ various known techniques. Each of the delay adjusters 1110-1, 1110-2, 1110-3 may additionally have a switch circuit so that the delay adjusters 1110-1, 1110-2, 1110-3 can be activated or deactivated by the chip ID numbers CID1, CID2, CID3.

In the semiconductor device of FIG. 20, the plurality of chips CH1, CH2, CH3 have chip selection pads Ctp for activating the delay adjusters 1110-1, 1110-2, 1110-3. When the test apparatus 20 receives and outputs data through the test pad tp of the first chip CH1 during a test operation, the test apparatus 20 applies the chip ID number CID1 through the chip selection pad Ctp of the first chip CH1 and applies neither the chip ID number CID2 nor the chip ID number CID3 to the chip selection pads Ctp of the other chips CH2, CH3.

In the description above, the chip selection signals CID1, CID2, CID3 are applied through the chip selection pads Ctp. However, when the delay adjusters 1110-1, 1110-2, 1110-3 are activated or deactivated through the chip selection pads Ctp as illustrated in FIG. 20, an activation signal may be applied to the chip selection pad Ctp of a specific chip CH1, CH2, or CH3 to activate the delay adjuster 1110-1, 1110-2, or 1110-3 of the specific chip.

In FIGS. 19 and 20, a through silicon via (TSV) is provided to communicate data and a signal between a plurality of stacked chips. In this technology referred to as wafer-level processed stack package (WSP), a via hole is formed to vertically penetrate respective stacked chips using a laser at the wafer level, and filled with a TSV to directly connect circuits of the respective stacked chips. In other words, the data and signal applied to the bump of the first chip CH1 can be applied to the bump of the adjacent chip CH2 through the TSV.

Figure 21:
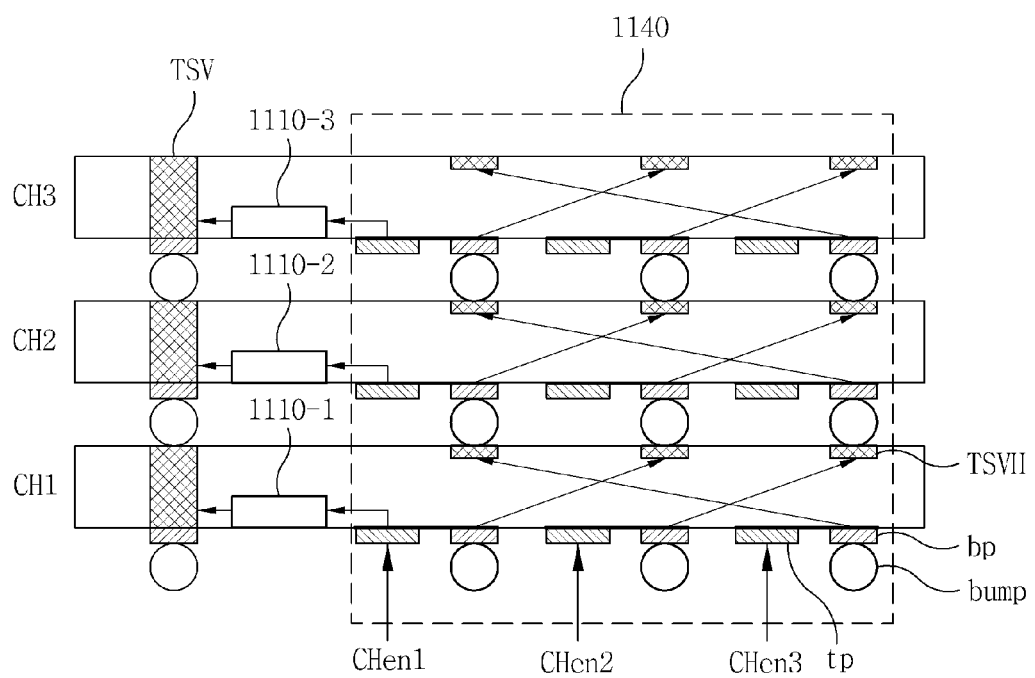
FIG. 21 illustrates a method of testing a multi-stack semiconductor device according to an exemplary embodiment.

FIG. 21 illustrates a method of testing a multi-stack semiconductor device according to an exemplary embodiment.

In FIG. 20, one of the stacked chips CH1, CH2, CH3 is selected using the chip ID numbers CID1, CID2, CID3 or an activation signal. In the multi-stack semiconductor device of FIG. 21, a method of activating a delay adjuster 1110-1, 1110-2, or 1110-3 of one of chips CH1, CH2, CH3 is illustrated, like in FIG. 20.

The semiconductor device of FIG. 21 has a selection activator 1140. The selection activator 1140 has a plurality of bump pads bp connected to a plurality of bumps, a plurality of test pads tp electrically connected to the plurality of bump pads bp, and partial TSVs TSVH for connecting the plurality of bump pads bp with bumps of an adjacent chip. As illustrated in FIG. 21, the numbers of bumps, bump pads bp, test pads tp, and partial TSVs TSVH of the selection activator 1140 in each of the chips CH1, CH2, CH3 need to be the number of the stacked chips or more so that the stacked chips can be separately selected.

The TSVs shown in FIGS. 19 and 20 are implemented by a via-last process in which a TSV is formed after a plurality of layers are formed during a semiconductor chip manufacturing process. On the other hand, the partial TSVs TSVH of the selection activator 1140 of FIG. 21 may be implemented by a via-middle process in which some layers are formed, TSVs are formed, and then other layers SL are formed.

As illustrated in FIG. 21, the bump pads bp of the selection activator 1140 in each of the chips CH1, CH2, CH3 are electrically connected to the corresponding partial TSVs TSVH by interconnections in the chip. Here, bump pads bp are electrically connected not with partial TSVs TSVH at the corresponding positions but with partial TSVs TSVH at positions corresponding to adjacent bump pads bp, and a bump pad bp at the end of one side is electrically connected with a partial TSV TSVH at the end of the other side. In other words, in each of the chips CH1, CH2, CH3, the bump pads bp and the partial TSVs TSVH of the selection activator 1140 are connected in the form of rotation.

In each of the chips CH1, CH2, CH3, one of the plurality of test pads tp of the selection activator 1140 is electrically connected with the respective delay adjuster 1110-1, 1110-2, 1110-3 on the same chip and applies the corresponding chip activation signal CHen1, CHen2, or CHen3 to the connected delay adjuster 1110-1, 1110-2, or 1110-3. In each of the chips CH1, CH2, CH3, the delay adjuster 1110-1, 1110-2, or 1110-3 delays data and a signal applied from the test apparatus 20 through the test pad tp for different time periods in response to the chip activation signal CHen1, CHen2, or CHen3 applied through the connected test pad tp, and transfers the delayed data and signal to the corresponding bump pad bp.

Thus, the semiconductor device shown in FIG. 21 may activate or deactivate the delay adjusters 1110-1, 1110-2, 1110-3 in the respective chips CH1, CH2, CH3 by applying the respective chip activation signal CHen1, CHen2, or CHen3 through a test pad tp of the selection activator 1140.

For example, the test apparatus 20 may apply the second chip activation signal CHen2 to activate the delay adjuster 1110-2 of the second chip CH2, and the third chip activation signal CHen3 to activate the delay adjuster 1110-3 of the third chip CH3.

In the drawings, the partial TSVs TSVH are only used in the selection activator 1140, but may be used in the other area of the chips CH1, CH2, CH3.

Hereinabove, a semiconductor memory device has been described as an exemplary embodiment of a semiconductor device, but the exemplary embodiments of the inventive concept are not limited to semiconductor memory devices, but can include other semiconductor devices.

As described above, in a test system of a semiconductor device according to the exemplary embodiments, data applied through a bump pad on which a μ-bump is mounted is received by a test apparatus through a test pad, and the test apparatus performs a test, so that the reliability of the test can be improved. Also, since data output through bump pads can be selectively applied to a test pad, the amount of test pads can be significantly reduced. Further, since data and signals applied from a test pad are synchronized with each other and then applied to the bump pad during a test operation, the reliability of the test can be improved, and additional test chips are not required.

While the foregoing is illustrative of exemplary embodiments, it is not to be construed as limiting thereof. Although practical exemplary embodiments have been described, those skilled in the art will readily appreciate that many modifications are possible in exemplary embodiments without materially departing from the present inventive concept. For example, exemplary embodiments can be applied to a measurement method for monitoring process variation in semiconductor equipment. Accordingly, all such modifications, as well as other embodiments, are intended to be included within the scope of the appended claims.

What is claimed is:

1. A semiconductor device, comprising:
    a plurality of bump pads on which bumps are formed;
    an internal circuit configured to exchange data with the outside through the bump pads and to perform a predetermined operation;
    a plurality of test pads fewer than the bump pads, each test pad configured to exchange data between a corresponding at least one of the bump pads and a test apparatus during a test operation; and
    a test data selector connected between the bump pads and the test pads, and configured to select a predetermined amount of bump pads from among the bump pads in response to an extended address applied from the test apparatus and to exchange data between the selected bump pads and a test pad corresponding to the selected bump pads.

2. The semiconductor device according to claim 1, wherein the test data selector includes:
    one or more pad multiplexers configured to select the predetermined amount of bump pads in response to the extended address and to exchange the data through the selected bump pads; and
    one or more pad buffers configured to receive data from the pad multiplexers and to buffer and output the data to the corresponding test pad or to buffer data applied from the corresponding test pad and apply the data to a corresponding pad multiplexer among the pad multiplexers.

3. The semiconductor device according to claim 2, wherein the test data selector operates at the same operating speed as the internal circuit.

4. The semiconductor device according to claim 2, wherein the test data selector operates at an operating speed that is multiple times an operating speed of the internal circuit.

5. The semiconductor device according to claim 1, wherein the internal circuit includes a clock input buffer connected to one of the test pads and configured to receive a test clock signal applied from the test apparatus in response to a test mode signal and generate an internal clock signal, and
    outputs sampling data for measuring a data output time in response to the internal clock signal.

6. The semiconductor device according to claim 5, further comprising a sampling circuit disposed adjacent to a data bump pad from which the sampling data is output among the bump pads and configured to detect the sampling data in response to a strobe signal applied from the test apparatus and to output a determination signal to a corresponding test pad among the test pads,
    wherein a path through which the strobe signal is applied from the test apparatus to the sampling circuit has the same length as a path through which the test clock signal is applied from the test apparatus to the clock input buffer.

7. The semiconductor device according to claim 6, wherein the sampling circuit includes:
    a data determiner configured to receive the strobe signal in response to the test mode signal, to detect the sampling data in response to the strobe signal, and to output the determination signal; and
    a sampling buffer configured to buffer and to output the determination signal in response to the test clock signal.

8. The semiconductor device according to claim 7, wherein a phase of the strobe signal is initially the same as a phase of the test clock signal.

9. The semiconductor device according to claim 1, further comprising an extended test pad disposed adjacent to and connected to one or more dummy bump pads, wherein one or more of the bump pads are the dummy bump pads.

10. The semiconductor device according to claim 9, wherein each of the dummy bump pads receives the same data as a corresponding bump pad among the bump pads.

11. A semiconductor device, comprising:
a plurality of bump pads;
a plurality of test pads configured to exchange test data with respective corresponding bump pads during a test operation; and
a delay adjuster connected between the bump pads and the test pads and configured to synchronize the test data with each other by delaying the test data for different time periods.

12. The semiconductor device according to claim 11, wherein the test data includes a clock signal, data, and a command, and
the delay adjuster includes an input delay adjuster configured to synchronize the data and the command with the clock signal and transfer the clock signal, the synchronized data, and the synchronized command to the bump pads corresponding to the respective test pads when the test data is applied through the test pads.

13. The semiconductor device according to claim 12, wherein the input delay adjuster includes:
a clock delayer configured to delay the clock signal applied through the test pad; and
a plurality of delayers configured to synchronize the data and the command applied through the test pads with the clock signal and output the clock signal, the synchronized data, and the synchronized command to the bump pads corresponding to the respective test pads.

14. The semiconductor device according to claim 12, wherein the input delay adjuster includes:
a clock delayer configured to delay the clock signal applied through the test pad;
a clock generator configured to generate and output a synchronization clock signal in response to the clock signal; and
a plurality of latches configured to synchronize the data and the command applied through the test pads with the clock signal and output the clock signal, the synchronized data, and the synchronized command to the bump pads corresponding to the respective test pads in response to the synchronization clock signal.

15. The semiconductor device according to claim 12, wherein the delay adjuster further includes an output delay adjuster configured to synchronize the data and the command with the clock signal and transfer the clock signal, the synchronized data, and the synchronized command to the test pads corresponding to the respective bump pads when the test data is applied through the bump pads.

16. A semiconductor device comprising a plurality of stacked chips, wherein at least one of the chips comprises:
a plurality of bump pads;
a plurality of test pads configured to exchange test data with respective corresponding bump pads during a test operation; and
a delay adjuster connected between the bump pads and the test pads and configured to synchronize the test data with each other by delaying the test data for different time periods.

17. The semiconductor device according to claim 16, wherein the test data includes a clock signal, data, and a command, and
the delay adjuster includes an input delay adjuster configured to synchronize the data and the command with the clock signal and transfer the clock signal, the synchronized data, and the synchronized command to the bump pads corresponding to the respective test pads when the test data is applied through the test pads.

18. The semiconductor device according to claim 17, wherein the delay adjuster further includes an output delay adjuster configured to synchronize the data and the command with the clock signal and transfer the clock signal, the synchronized data, and the synchronized command to the test pads corresponding to the respective bump pads when the test data is applied through the bump pads.

19. The semiconductor device according to claim 16, wherein each of the chips activates or deactivates the delay adjuster in response to a chip identification number applied from the outside.

20. The semiconductor device according to claim 16, wherein each of the chips includes a selection activator configured to receive a plurality of chip activation signals for selectively activating the delay adjuster and transfer the chip activation signals to an adjacent chip.

* * * * *